United States Patent [19]
Tokuhara et al.

[11] Patent Number: 5,093,715
[45] Date of Patent: Mar. 3, 1992

[54] ADAPTIVE COMB FILTER FOR SEPARATING AT LEAST ONE COMPONENT OF A VIDEO SIGNAL

[75] Inventors: Masaharu Tokuhara; Hiroyuki Kita; Hidefumi Naito, all of Kanagawa, Japan

[73] Assignee: Sony Corporation, Tokyo, Japan

[21] Appl. No.: 560,873

[22] Filed: Jul. 31, 1990

[30] Foreign Application Priority Data

Aug. 10, 1989 [JP] Japan ................................. 1-207459
Aug. 17, 1989 [JP] Japan ................................. 1-211629
Aug. 23, 1989 [JP] Japan ................................. 1-216263

[51] Int. Cl.⁵ ............................................. H04N 9/64
[52] U.S. Cl. ................................................... 358/31
[58] Field of Search ......................................... 358/31

[56] References Cited

U.S. PATENT DOCUMENTS

| | | | |
|---|---|---|---|
| 4,707,732 | 11/1987 | Matono et al. | 358/31 |
| 4,766,487 | 8/1988 | Tanaka et al. | 358/31 |
| 4,809,060 | 2/1989 | Saeki | 358/31 |
| 4,862,252 | 8/1989 | Kuroda | 358/31 |
| 4,930,012 | 5/1990 | Fujita | 358/31 |
| 4,994,906 | 2/1991 | Moriwake | 358/31 |

FOREIGN PATENT DOCUMENTS

| | | | |
|---|---|---|---|
| 9151592 | 8/1984 | Japan | 358/31 |
| 2054313 | 2/1981 | United Kingdom | 358/31 |

OTHER PUBLICATIONS

Y. Farondja et al., "Improving NTSC to Achieve Near-RGB Performance", Aug. 1987, p. 760.
J. P. Rossi, "Digital TV Comb Filter with Adaptive Features", Jul. 1976.

Primary Examiner—Howard W. Britton
Assistant Examiner—Wendy R. Greening
Attorney, Agent, or Firm—Alvin Sinderbrand; William S. Frommer

[57] ABSTRACT

An adaptive comb filter for separating at least one component of a video signal includes a filter input terminal for receiving the video signal, a first delay device for delaying the video signal by a first interval to produce a first delayed video signal, a second delay device for delaying the video signal by a second interval to produce a second delayed video signal, a first signal subtractor for producing a first difference signal proportional to a difference between the video signal and the first delayed video signal, a second subtractor for producing a second difference signal proportional to a difference between the first delayed video signal and the second delayed video signal, a first signal summing device for producing a first summation signal proportional to a summation of the first difference signal and the second difference signal, a signal selecting device for controllably selecting one of the first difference signal, the second difference signal and the first summation signal as the separated component of the video signal, a second summing device for producing a second summation signal proportional to a summation of the video signal and the first delayed video signal, a third summing device for producing a third summation signal proportional to a summation of the first delayed video signal and the second delayed video signal, and a controller for controlling the selection of the separated component of the video signal by the signal selecting device based upon relative magnitudes of the second summation signal and the third summation signal. In addition a method of separating a chrominance signal from a composite color video signal is provided.

27 Claims, 22 Drawing Sheets

FIG. 3 (PRIOR ART)
a 
b 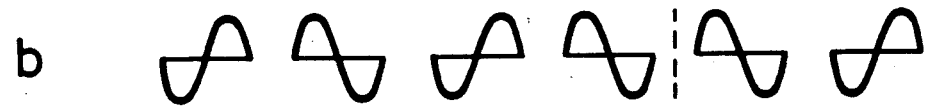
c 
a+b 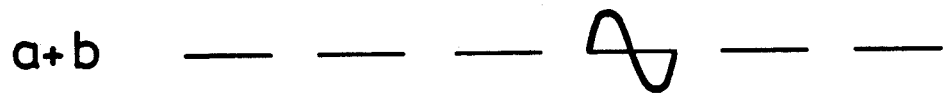
b+c 
| ⓧ | 0 | 0 | 0 | 1 | 0 | 0 |
| ⓨ | 0 | 0 | 0 | 0 | 1 | 0 |
Ⓧ 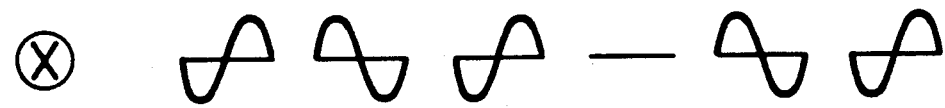
Ⓨ 
| Ⓧ' | 1 | 1 | 1 | 0 | 1 | 1 |
| Ⓨ' | 1 | 1 | 1 | 1 | 0 | 1 |
"C" 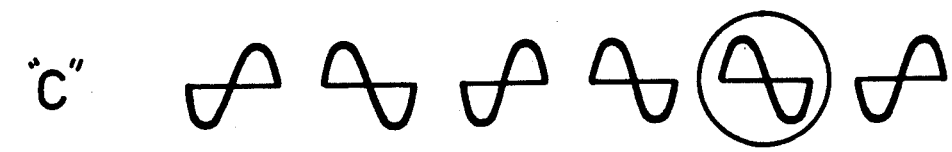

FIG. 4 (PRIOR ART)
a 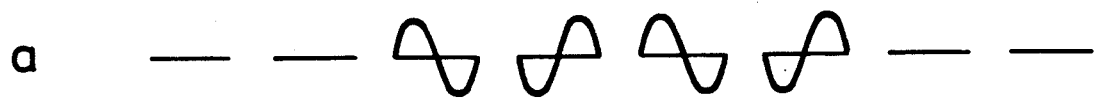
b 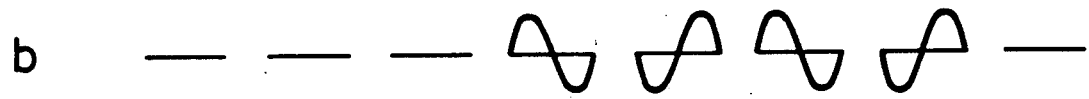
c 
a+b 
b+c 
| Ⓧ | 0 | 0 | 1 | 0 | 0 | 0 | 1 | 0 |
|---|---|---|---|---|---|---|---|---|
| Ⓨ | 0 | 0 | 0 | 1 | 0 | 0 | 0 | 1 |
Ⓧ 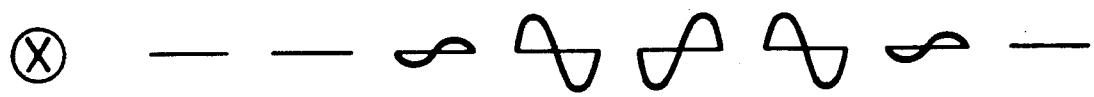
Ⓨ 
| Ⓧ' | 0 | 0 | 1 | 1 | 1 | 1 | 1 | 0 |
|----|---|---|---|---|---|---|---|---|
| Ⓨ' | 0 | 0 | 0 | 1 | 1 | 1 | 1 | 1 |
"c" 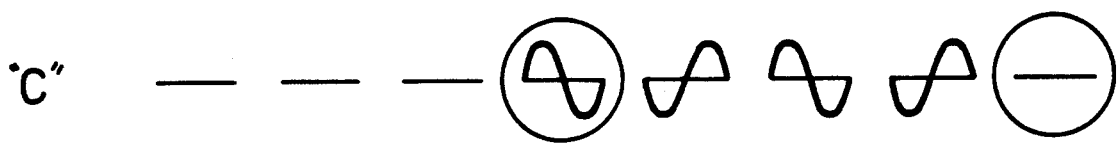

FIG. 5 (PRIOR ART)
a 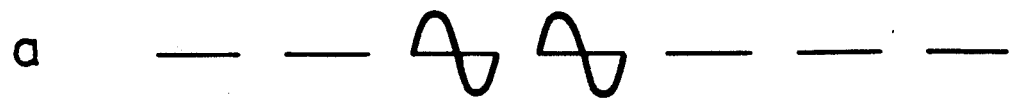
b 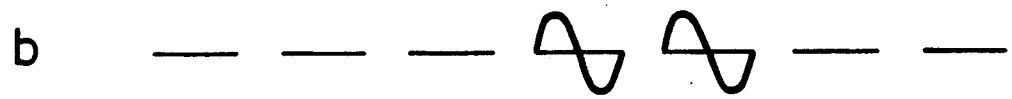
c 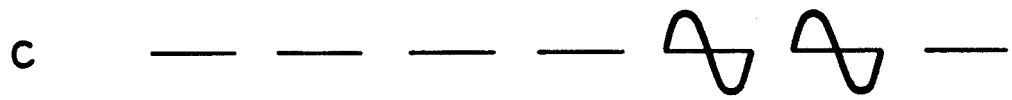
a+b 
b+c 
Ⓧ  0  0  1  1  1  0  0
Ⓨ  0  0  0  1  1  1  0
Ⓧ 
Ⓨ 
Ⓧ'  0  0  1  0  1  0  0
Ⓨ'  0  0  0  1  0  1  0
"C" 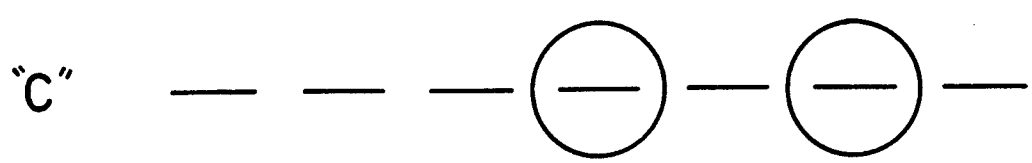

FIG. 6 (PRIOR ART)
a 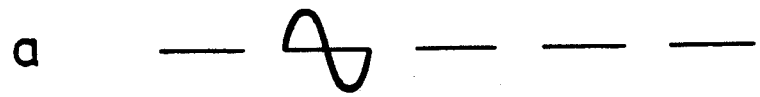
b 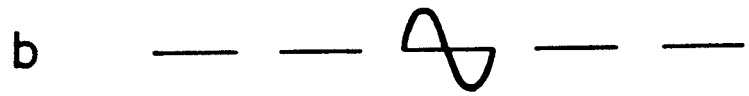
c 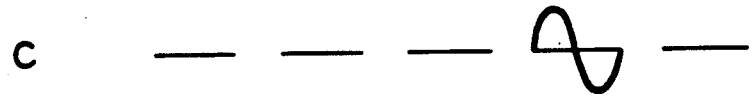
a+b 
b+c 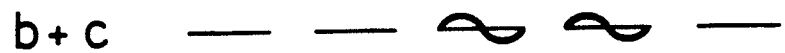
ⓧ    0    1    1    0    0
ⓨ    0    0    1    1    1
Ⓧ 
Ⓨ 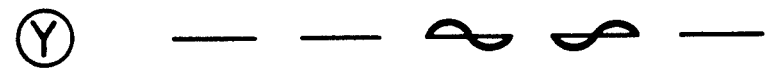
Ⓧ'    0    1    1    0    0
Ⓨ'    0    0    1    1    0
Ⓩ 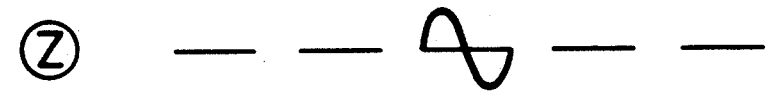
"C" 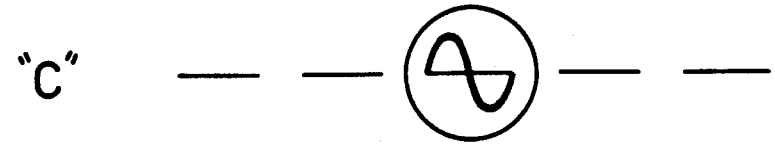

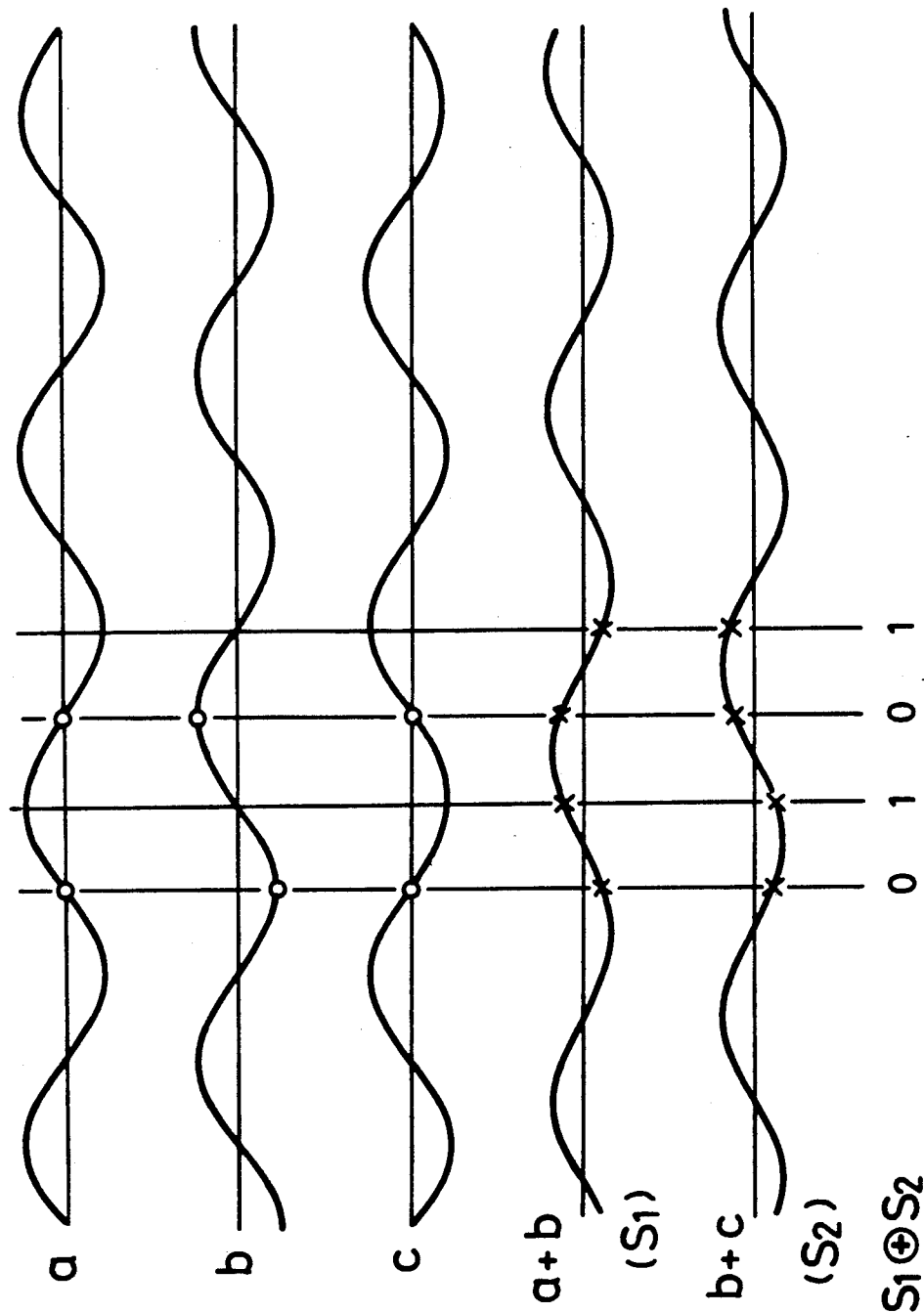

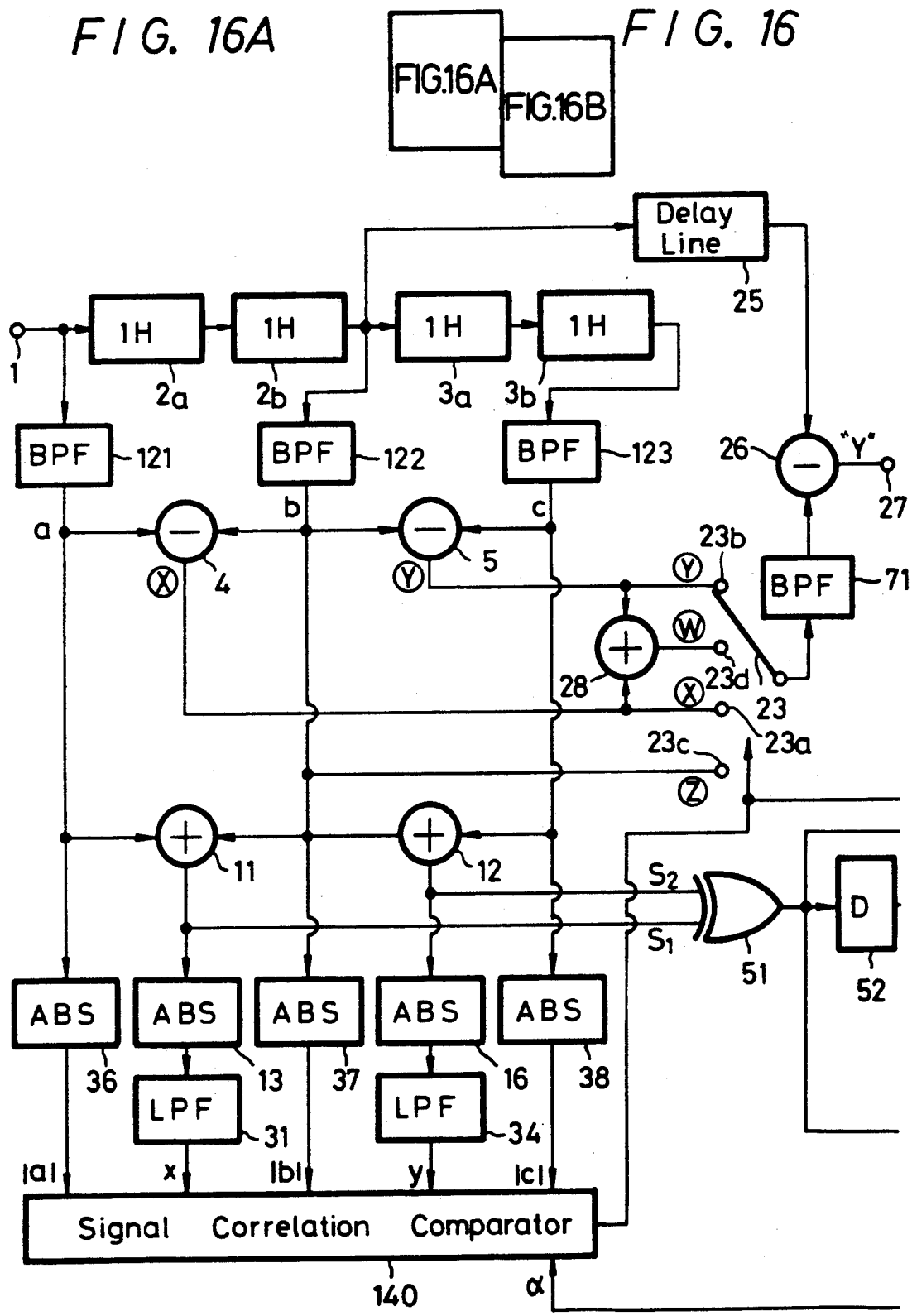

ADAPTIVE COMB FILTER FOR SEPARATING AT LEAST ONE COMPONENT OF A VIDEO SIGNAL

BACKGROUND OF THE INVENTION

1. Field of the Invention

The present invention relates generally to comb filtering apparatus and methods and, in particular, to adaptive comb filters and methods for separating luminance and chrominance signals from a video signal.

2. Description of the Prior Art

Band pass filters have been commonly utilized for separating luminance and chrominance signals of, for example, an NTSC composite color video signal. However, such band pass filters when used alone to effect signal separation are unable to distinguish between chrominance signals and luminance signals falling within the chrominance frequency band, typically 3.58 MHz ±500 kHz. This effect, commonly referred to as "cross color", results in the deterioration of the quality of an image produced with the use of chrominance signals separated by band pass filtering.

Comb filters provide improved luminance and chrominance signal separation by utilizing the general vertical correlation of video signals and, in the case of an NTSC or PAL composite color video signal, the phase inversion of the chrominance subcarrier signal which occurs with every new or every other new horizontal line of the video signal, respectively. With reference to FIG. 1, a typical comb filter arrangement for separating luminance signals (indicated as "Y") and chrominance signals (indicated as "C") from an NTSC composite color video signal (indicated as "Y+C") is illustrated therein. The composite color video signal ("Y+C") is applied to an input terminal 101 of the comb filter connected to an input terminal of a delay line (1H) 102 which is operative to provide the composite color video signal "Y+C" delayed by one horizontal line interval at an output terminal thereof. The "Y+C" signal received at the input terminal 101 is also applied to a first input of a subtracting circuit 103 having a second input connected to the output terminal of the delay line 102. Since the luminance signal components of successive horizontal lines are in-phase signals which generally possess vertical correlation, the subtracting circuit 103 serves to attenuate luminance signal components of the delayed composite color video signal "Y+C" as the same is provided at an output terminal thereof.

The output terminal of the subtracting circuit 103 is connected to an input of a band pass filter (BPF) 104 having a pass band corresponding with the frequency range of the chrominance signal "C" and, accordingly, provides a separated chrominance signal component "C" at an output terminal thereof which is connected to an output terminal 105 of the comb filter. The output terminal of the band pass filter 104 is also connected to a first input of a further subtracting circuit 107. A delay line 106 has an input connected to the input terminal 101 to receive the composite color video signal "Y+C" and is operative to delay the "Y+C" signal by an interval corresponding to the delays introduced by the delay line 102 and the band pass filter 104. The delay line 106 provides the delayed composite color video signal "Y+C" to a second input of the subtracting circuit 107. Accordingly, the subtracting circuit 107 serves to attenuate chrominance signal components present in the composite color video signal "Y+C" and thereby provides a separated luminance signal component "Y" to an output terminal 108 of the comb filter.

However, vertical correlation of the chrominance signal is not always present. For example, where a change to a complementary color occurs in the chrominance signal in a given scanning line, the phase of the chrominance signal becomes inverted so that vertical correlation thereof with the chrominance signal of the preceding scanning line no longer exists. Not only does this result in the deterioration of the output chrominance signal, but the luminance signal "Y" provided at the output terminal 108 retains portions of the chrominance signal which otherwise would have been suppressed by the subtracting circuit 107, resulting in so-called "dot interference" in the reproduced video image.

On the other hand, where vertical correlation between luminance signals of successive line intervals is lacking, the chrominance signal output by the subtracting circuit 103 possesses a residual component of the luminance signal therein. Accordingly, when this occurs such components may appear at the output of the band pass filter 104, resulting in a cross color effect similar to that encountered in the use of a band pass type signal separation technique of the kind described hereinabove.

In order to overcome the effects resulting from vertical non-correlation, it has been proposed in Japanese Patent application No. 63-301762, assigned to the assignee of the instant application, that vertical correlation of luminance signals in the pass band of the chrominance signal be detected to carry out adaptive comb filtering techniques to avoid such unwanted effects. FIG. 2 illustrates the overall circuit arrangement of the adaptive comb filter disclosed therein.

With reference to FIG. 2, an NTSC composite color video signal "Y+C" is supplied to an input terminal 1 thereof. A first delay line (1H) 2 has an input coupled with the input terminal 1 and is operative to delay the composite color video signal "Y+C" by one horizontal line interval which it then provides at an output terminal thereof. The output terminal of the first delay line 2 is coupled with an input of a second delay line (1H) 3 which is operative to delay the composite color video signal "Y+C" from the output terminal of first delay line 2 by an additional horizontal line interval which it then provides at an output terminal thereof. A first subtracting circuit 4 has two inputs each connected with a respective one of the input terminal 1 and the output terminal of the first delay line 2 and serves to provide a signal at an output terminal thereof representing the difference between the input composite color video signal and a prior version thereof delayed by one horizontal line interval. A second subtracting circuit 5 has two inputs each coupled with a respective one of the output terminals of the first and second delay lines 2 and 3 and serves to provide a signal at an output terminal thereof representing the difference between the composite color video signals respectively delayed by one and two horizontal line intervals with respect to the signal provided at the input terminal 1.

Each of a plurality of band pass filters (BPF) 6, 7, 8, 9 and 10 has a pass band substantially corresponding with the frequency band of the chrominance signal component of the composite color video signal "Y+C". Each of the band pass filters 6–10 has a respective input correspondingly connected with a respective one of the input terminal 1, the output terminal of the first subtracting circuit 4, the output terminal of the first delay line 2, the output terminal of the second subtracting circuit 5 and the output terminal of the second delay line 3. A first adding circuit 11 has a first input connected with an output terminal of the band pass filter 6 and a second input connected with an output terminal of the band pass filter 8. A second adding circuit 12 has a first input connected with the output terminal of the band pass filter 8 and a second input connected with an output terminal of the band pass filter 10.

Each of a pair of absolute value generating circuits (ABS) 13 and 16 is operative to produce absolute value signals at a respective output terminal thereof representing absolute values of signals input thereto. The output terminal of first adding circuit 11 is connected with the input of absolute value generating circuit 13, while the output terminal of second adding circuit 12 is connected with the input of absolute value generating circuit 16. Each of a pair of coding circuits 17 and 20 is operative to convert signals received at an input thereof to a respective binary code $(x)$ and $(y)$ through comparison of the input signals with a predetermined voltage level. The output terminal of absolute value generating circuit 13 is connected to the input of coding circuit 17, while the output terminal of absolute value generating circuit 16 is connected to the input of coding circuit 20. Each of the coding circuits 17 and 20 has an output terminal coupled with a respective input of a logic signal processor 21.

The band pass filters 7 and 9 produce respective output signals $(X)$ and $(Y)$ which are produced in the same fashion as the output chrominance signal provided at the output terminal 105 of the comb filter of FIG. 1. The output terminal of the band pass filter 8 is connected with an input of a further band pass filter (BPF) 22 having a pass band similar to that of band pass filters used alone without comb filtering to separate chrominance signals, as first described above. The band pass filter 22 produces an output signal $(Z)$ corresponding with the output chrominance signal produced by the band pass filtering technique. A switching circuit 23 has a first input terminal 23a connected with the output terminal of the band pass filter 7 to receive the signal $(X)$ therefrom, a second input terminal 23b connected with the output terminal of the band pass filter 9 to receive the signal $(Y)$ therefrom and a third input terminal 23c connected with an output terminal of the band pass filter 22 to receive the signal $(Z)$ therefrom. The switching circuit 23 is operative to connect an output terminal thereof to one of the input terminals 23a-c under the control of the logic signal processor 21.

In addition, the output terminals of the band pass filters 7 and 9 are each connected with an input of a respective absolute value generating circuit (ABS) 14 and 15 which, like circuits 13 and 16, are each operative to produce output signals at an output terminal thereof representing an absolute value of signals input thereto. The output terminals of the absolute value generating circuits 14 and 15 are each connected to an input of a respective one of third and fourth coding circuits 18 and 19 each of which is operative to convert the absolute value signal received thereby to a respective binary code $(X)'$ and $(Y)'$ by comparing the absolute value signal with a predetermined voltage level. An output terminal of third coding circuit 18 is connected with an input of the logic signal processor 21 to supply the signal $(X)'$ thereto, while the fourth coding circuit 19 has an output terminal connected with an input of the logic signal processor 21 to supply the logic signal $(Y)'$ thereto.

The logic signal processor 21 logically compares the logic signals $(x)$, $(X)'$, $(Y)'$ and $(y)$ in accordance with Table I below such that the switching circuit 23 selects a respective one of the signals $(X)$, $(Y)$ and $(Z)$ in accordance with the signal states indicated in Table I, wherein a dash sign ("—") represents an indefinite state.

TABLE I

| $(x)$ | $(y)$ | $(X)'$ | $(Y)'$ | selection of input signals by switching circuit 23 |
|---|---|---|---|---|
| 0 | 0 | — | — | $(Y)$ |
| 0 | 1 | — | — | $(X)$ |
| 1 | 0 | — | — | $(Y)$ |
| 1 | 1 | — | 0 | $(Y)$ |
| 1 | 1 | 0 | 1 | $(X)$ |
| 1 | 1 | 1 | 1 | $(Z)$ |

The output terminal of the switching circuit 23 is connected with an output terminal 24 of the comb filter circuit to provide a chrominance signal component "C" of the input composite color video signal "Y+C" thereto. In order to produce a luminance signal "Y" from the input composite color video signal "Y+C", a third delay line 25 is provided having an input connected with the output terminal of the first delay line 2 and is operative to delay the composite color video signal at the output terminal of the first delay line 2 by an interval corresponding with the signal delay produced by each of the band pass filters 7 and 9. An output terminal of the third delay line 25 is connected with a first input of a third subtracting circuit 26 having a second input connected with the output terminal 24. The subtracting circuit 26 is operative to produce the luminance signal "Y" by subtracting the output chrominance signal "C" supplied at the output terminal 24 from the delayed composite color video signal "Y+C", and provides the thus produced luminance signal "Y" to a luminance signal output terminal 27 of the comb filter circuit.

With reference to FIG. 3, the phases of exemplary output signals provided by the band pass filters 6, 8 and 10 are illustrated therein by waveforms a, b and c, respectively, wherein the waveforms of coincident signals are vertically aligned. Phases of other signals as well as logic levels of coded signals appearing at respective terminals of the FIG. 2 circuit are also illustrated in FIG. 3. In the example of FIG. 3, a phase inversion of the chrominance signal representing a change to a complementary color is represented by a vertical dashed line in each of the waveforms a, b and c. In the example of FIG. 3, the luminance signal is constant.

When the signals represented by the waveforms a, b, and c are supplied as inputs to the first and second adding circuits 11 and 12, they combine subtractively to cancel one another so long as their phases are inverted. However, upon the occurrence of a color change as described above, the phases of these signals on successive lines coincide so that they combine additively as shown for the waveforms "a+b" and "b+c" in FIG. 3, thereupon resulting in a logic "one" output by the respective coding circuits 17 and 20 represented by the signals $(x)$ and $(y)$ in FIG. 3 Conversely, the outputs $(X)$ and $(Y)$ provided respectively by the band pass filters 7 and 9 from the outputs of the first and second signal subtracting circuits 4 and 5 are eliminated upon the occurrence of a color change.

When this takes place, the circuit of FIG. 1 eliminates the chrominance signal components of the horizontal line interval in which the color change occurs, resulting in dot interference. To avoid this result in the operation of the FIG. 2 adaptive filter circuit, the logic signal processor 21 is operative to control the switch 23 so that it selects the signal $\widehat{X}$ at such times that $(\widehat{x}, \widehat{y}) = (0,1)$ indicating that a color change has occurred between the signals applied to the input terminals of the second adding circuit 12, so that a drop out of the chrominance signal "C" is avoided. It will be seen also from Table I that, upon the occurrence of a color change between the signals input to the first adding circuit 11, resulting in the production of logic signals $(\widehat{x}, \widehat{y}) = (1,0)$, the signal $\widehat{Y}$ is selected instead of the signal $\widehat{X}$, such that chrominance signal drop out likewise is avoided at such time. Accordingly, a reduction in the level of the chrominance signal "C" due to chrominance signal inversion is thus avoided so that the chrominacne signal "C" produced at the output terminal 24 corresponds with the chrominance signal component in the composite color video signal "Y+C" provided at the output of the delay line 25. Accordingly, a luminance signal "Y" will be provided at the output terminal 27 which is free of dot interference under these circumstances.

Referring now to FIG. 4, the phases of further exemplary output signals from band pass filters 6, 8 and 10 are illustrated therein by waveforms a, b and c respectively, where a chrominance signal first appears on a given horizontal line of the composite color video signal "Y+C", while the level of the luminance signal is constant. Phases and amplitudes of other signals together with logic levels of coded signals appearing at respective terminals of the FIG. 2 circuit are also illustrated in FIG. 4. Where a composite color video signal having these characteristics is applied to the comb filter shown in FIG. 1, a deterioration in the level of the chrominance signal output by the subtracting circuit 103 occurs as shown in the case of the signals $\widehat{X}$ and $\widehat{Y}$ of FIG. 4. The result is a deterioration in the vertical resolution of the image produced with the use of the signals output by the FIG. 1 filter circuit. However, in the case of the adaptive comb filter of FIG. 2, the partially attenuated signals $\widehat{X}$ and $\widehat{Y}$ are rejected thereby such that vertical resolution is improved under these conditions.

With reference to FIG. 5, the phases of still further exemplary output signals from band pass filters 6, 8 and 10 are represented by waveforms a, b and c, respectively, thereof to illustrate luminance signal components within the frequency band of the chrominance signal, such that the phases thereof coincide on successive horizontal scan lines. The corresponding amplitudes and states of signals appearing elsewhere in the circuit of FIG. 2 simultaneously therewith likewise are illustrated in FIG. 5. With reference again to Table I, it will be seen that the presence of such luminance signals at the output of the band pass filter 8 simultaneously with the presence thereof either at the output of band pass filter 6 or 10 results in a logic signal combination $(\widehat{x}, \widehat{y}) = (1,1)$, whereupon the signal $\widehat{Y}$ output by the band pass filter 9 is selected by the switching circuit 23 whenever the signal $\widehat{Y}' = 0$ (to reject the residual luminance signal component concurrently present in the signal $\widehat{X}$), whereas the signal $\widehat{X}$ is selected by the switching circuit 23 whenever the signal combination $(\widehat{X}', \widehat{Y}') = (0,1)$ (to reject the residual luminance signal component then present in the signal $\widehat{Y}$). Accordingly, under the circumstances illustrated in FIG. 5, a chrominance signal "C" free of such luminance signal components is produced at the output terminal 24.

Referring now to FIG. 6, outputs from band pass filters 6, 8 and 10 are symbolized therein by the waveforms a, b and c, respectively, which represent the existence of a chrominance signal on only one particular scanning line, while the level of the luminance signal is simultaneously constant. The corresponding amplitudes and states of signals appearing elsewhere in the circuit of FIG. 2 simultaneously therewith likewise ar illustrated in FIG. 6. It will be seen from FIG. 6 that, whether the signal $\widehat{X}$ or the signal $\widehat{Y}$ is selected when this solitary chrominance signal appears at the output of the band pass filter 8, a deterioration in the level thereof is unavoidable. Accordingly, under these circumstances, the chrominance signal $\widehat{Z}$ provided at the output terminal of the band pass filter 22 is selected by the switching circuit 23, as will be seen with reference to Table I under the conditions that $\widehat{x}, \widehat{y}, \widehat{X}'$ and $\widehat{Y}'$ all equal a logic "one" level indicating that neither the luminance signal nor the chrominance signal possesses vertical correlation. Under these circumstances, the signal $\widehat{Z}$ is provided at the output terminal 24 by the switching circuit 23 and is free of the signal deterioration then present in the signals $\widehat{X}$ and $\widehat{Y}$.

In summary, the first and second adding circuits 11 and 12 and the first and second signal subtracting circuits 4 and 5 serve respectively to produce signals indicating vertical correlation of the luminance signal and of the chrominance signal, so that signals which strongly correlate may be selected to produce the output chrominance signal "C". On the other hand, when the signals do not correlate satisfactorily, the output from the conventional band pass filter circuit is instead selected to produce luminance and chrominance signals of high quality.

With reference now to FIG. 7, wherein elements corresponding to those illustrated in FIG. 2 bear the same reference numerals, a third adding circuit 28 has a first input connected with the output terminal of the band pass filter 9 to receive the signal $\widehat{Y}$ therefrom and a second input connected with the output terminal of the band pass filter 7 to receive the signal $\widehat{X}$ therefrom. The third adding circuit 28 is operative to provide an output signal $\widehat{W}$ in accordance with the following relationship:

$$\widehat{W} = \frac{\widehat{X} + \widehat{Y}}{2} = \frac{(b-a) + (b-c)}{2} \qquad (1)$$

Accordingly, the third adding circuit 28 produces a signal $\widehat{W}$ based on the correlation of three horizontal scan lines and corresponding with the output of a so-called 2H comb filter. An output terminal of the third adding circuit 28 is connected to a fourth input 23d of the switching circuit 23.

In the adaptive comb filter of FIG. 7, a modified logic signal processor 100 is operative to control the operation of the switching circuit in accordance with the logic signals $\widehat{x}, \widehat{y}, \widehat{X}'$ and $\widehat{Y}'$ input thereto in accordance with Table II below, the logic signal states are expressed in the same manner as in Table I:

TABLE II

| x | y | x' | y' | selection of input signals by switching circuit 23 |
|---|---|---|---|---|
| 0 | 0 | — | — | Ⓦ |
| 0 | 1 | — | — | Ⓧ |
| 1 | 0 | — | — | Ⓨ |
| 1 | 1 | — | 0 | Ⓨ |
| 1 | 1 | 0 | 1 | Ⓧ |
| 1 | 1 | 1 | 1 | Ⓩ |

With reference to Table II, it will be seen that, when signal correlation is present between the signals appearing on the three successive horizontal scanning lines represented by the waveforms a, b and c, the logic signals Ⓧ and Ⓨ assume a low or "0" logic level such that the signal Ⓦ at the output of the third adding circuit 28 is selected by the switching circuit 23. Under the remaining conditions listed in Table II, the selection of the input signals by the switching circuit 23 corresponds to that of the FIG. 2 adaptive comb filter circuit as expressed in Table I.

Referring now to FIG. 8, exemplary chrominance signal waveforms a, b and c appearing at the output terminals of band pass filters 6, 8 and 10, respectively, are illustrated therein where a complementary color change resulting in a phase inversion occurs at successively later intervals differing by one-half of the color subcarrier wavelength from line to line at the output terminals of the band pass filters 6,8 and 10. The corresponding amplitudes and phases of signals appearing elsewhere in the circuit of FIG. 7 therewith simultaneously likewise are illustrated in FIG. 8. Under these circumstance, the signal Ⓦ is selected except at such times that the signals of two successive lines correspond in phase, whereupon either the signal Ⓧ or the signal Ⓨ is selected to avoid the concurrent deterioration in the level of the signal Ⓦ. Accordingly, in the adaptive comb filter of FIG. 7, when the signals a, b and c from successive horizontal scan lines exhibit good correlation, the adaptive comb filter acts as a 2H comb filter which provides superior separation of the chrominance signal. When the chrominance signal derived in this manner is subtractively combined with the composite color video signal "Y+C" in the subtracting circuit 26, dot interference can be reduced by 6 dB, thus providing improved image quality.

In the adaptive comb filter circuits of FIGS. 2 and 7, the coding circuits 17-20 compare the input absolute value signals with a pre-determined voltage level. In the event that the level of input signals changes, the coding circuits may be ineffective to properly encode the input signals if the level thereof does not reach the pre-determined voltage level. If the pre-determined voltage level is reduced in an attempt to enable proper encoding of weaker signals, the probability that noise present in the input signal will interfere with proper operation of the adaptive filter circuit is increased.

OBJECTS AND SUMMARY OF THE INVENTION

Accordingly, it is an object of the present invention to provide an improved adaptive comb filter which is able to eliminate the above mentioned disadvantages and problems associated with the prior art.

More specifically, it is an object of the present invention to provide an adaptive comb filter which is able to produce satisfactorily separated signal components despite changes in the level of the input signal.

It is another object of the present invention to provide an adaptive comb filter having simplified circuitry.

It is a further object of the present invention to provide an adaptive comb filter which is capable of separating a broad band chrominance signal of a composite color video signal without simultaneously compromising luminance signal resolution and while minimizing cross color effects.

It is a still further object of the present invention to proved an adaptive comb filter which affords improved separation of luminance and chrominance signal components from a color video signal in a color television receiver and in a video tape recorder.

In accordance with an aspect of the present invention, an adaptive comb filter for separating at least one component of a video signal comprises a filter input terminal for receiving said video signal; first and second signal delay means for delaying signals supplied to respective input terminals thereof and providing the delayed input signals at respective output terminals thereof, the input terminal of the first signal delay means being coupled with said filter input terminal and the output terminal of the first signal delay means being coupled with the input terminal of the second signal delay means; first and second signal subtracting means for producing output difference signals at respective output terminals thereof representing differences between signals supplied to respective first and second input terminals thereof, the first and second input terminals of the first signal subtracting means being coupled with the input and output terminals, respectively, of the first signal delay means, the first and second input terminals of the second signal subtracting means being coupled with the input and output terminals, respectively, of the second signal delay means; first signal adding means for producing a summation signal at an output terminal thereof representing a summation of signals received at first and second input terminals thereof, the first and second input terminals of the first signal adding means being respectively coupled with the output terminals of the first and second signal subtracting means, respectively; switching means for selectively providing one of a plurality of input signals received at respective input terminals thereof to an output terminal thereof, the switching means having first and second input terminals coupled with the output terminals of the first and second signal subtracting means, respectively, a third input terminal coupled with the output terminal of the first signal adding means and a fourth input terminal coupled with the output terminal of the first signal delay means, the output terminal of the switching means being operative to provide a first component of the video signal; second and third signal adding means for producing summation signals at respective output terminals thereof representing summations of signals received at first and second input terminals of the respective signal adding means, the first input terminals of the second and third signal adding means being coupled with the output terminal of the first signal delay means, the second input terminal of the second signal adding means being coupled with the filter input terminal, and the second input terminal of the third signal adding means being coupled with the output terminal of the second signal delay means; first and second absolute value means for producing output signals at respective output terminals thereof representing absolute values of signals received at respective input terminals thereof, the input terminals of the first and second absolute value means being coupled with the output terminals of the second and third signal adding means, respectively; and controlling means for controlling the selective provision of input signals by the switching means to its output terminal based upon a relative value of the output signals produced at the output terminals of the first and second absolute value means.

In accordance with another aspect of this invention, an adaptive comb filter for separating at least one component of a video signal comprises a filter input terminal for receiving said video signal; first delay means for delaying the video signal by a first interval to produce a first delayed video signal; second delay means for delaying the video signal by a second interval to produce a second delayed video signal; first difference means for producing a first difference signal proportional to a difference between the video signal and the first delayed video signal; second difference means for producing a second difference signal proportional to a difference between the first and second delayed video signals; first summing means for producing a first summation signal proportional to a summation of the first and second difference signals; first signal selecting means for controllably selecting one of the first difference signal, the second difference signal and the first summation signal as the at least one component of the video signal; second summing means for producing a second summation signal proportional to a summation of the video signal and the first delayed video signal; third summing means for producing a third summation signal proportional to a summation of the first delayed video signal and the second delayed video signal; and control means for controlling the selection of one of the first difference signal, the second difference signal and the first summation signal by the first signal selecting means based upon relative magnitudes of said second and third summation signals.

In accordance with a further aspect of this invention, a method of separating a chrominance signal from a composite color video signal comprises the steps of delaying the composite color video signal by a first interval to produce a first delayed video signal; delaying the composite color video signal by a second interval to produce a second delayed video signal; producing a first difference signal proportional to a difference between the composite color video signal and the first delayed video signal; producing a second difference signal proportional to a difference between the first and second delayed video signals; producing a first summation signal proportional to a summation of the first and second difference signals; producing a second summation signal proportional to a summation of the composite color video signal and the first delayed video signal; producing a third summation signal proportional to a summation of the first and second delayed video signals; and selecting one of the first difference signal, the second difference signal and the first summation signal as the chrominance signal based upon a comparison of relative magnitudes of the second and third summation signals.

The above, and other objects, features and advantages of the invention, will be apparent in the following detailed description of certain illustrative embodiments thereof which is to be read in connection with the accompanying drawings forming a part hereof, and wherein corresponding parts and components are identified by the same reference numerals in the several views of the drawings.

BRIEF DESCRIPTION OF THE DRAWINGS

FIG. 3 is a waveform diagram of signals present at respective terminals of the prior art comb filter illustrated in FIG. 2 supplied with an input composite color video signal whose chrominance signal component is inverted due to a color change;

FIG. 4 is a waveform diagram of signals appearing at respective terminals of the prior art comb filter illustrated in FIG. 2 supplied with a input composite color video signal having a chrominance signal component first appearing on a particular horizontal scan line;

FIG. 5 is a waveform diagram of signals appearing at respective terminals of the prior art comb filter illustrated in FIG. 2 supplied with an input composite color video signal having a luminance signal component on two horizontal scan lines and present within the chrominance signal band;

FIG. 6 is a waveform diagram of signals appearing at respective terminals of the prior art comb filter illustrated in FIG. 2 supplied with an input composite color video signal having a chrominance signal component present only on one horizontal scan line;

FIG. 13 is a waveform diagram of signals appearing at respective terminals of the adaptive comb filter illustrated in FIGS. 12A and 12B supplied with a luminance signal of approximately 3.58 MHz and to which reference is made in explaining the operation of the adaptive comb filter of FIGS. 12A and 12B;

FIG. 16 is a guide for viewing FIGS. 16A and 16B together;

FIGS. 16A and 16B together provide a circuit block diagram illustrating a sixth embodiment of an adaptive comb filter in accordance with the present invention for separating luminance and chrominance signal components of a PAL composite color video signal;

FIGS. 17-20 provide waveform diagrams of signals appearing at respective terminals of the adaptive comb filter illustrated in FIGS. 16A and 16B, and to which reference is made in explaining the operation thereof.

DETAILED DESCRIPTION OF CERTAIN PREFERRED EMBODIMENTS

Figure 7:
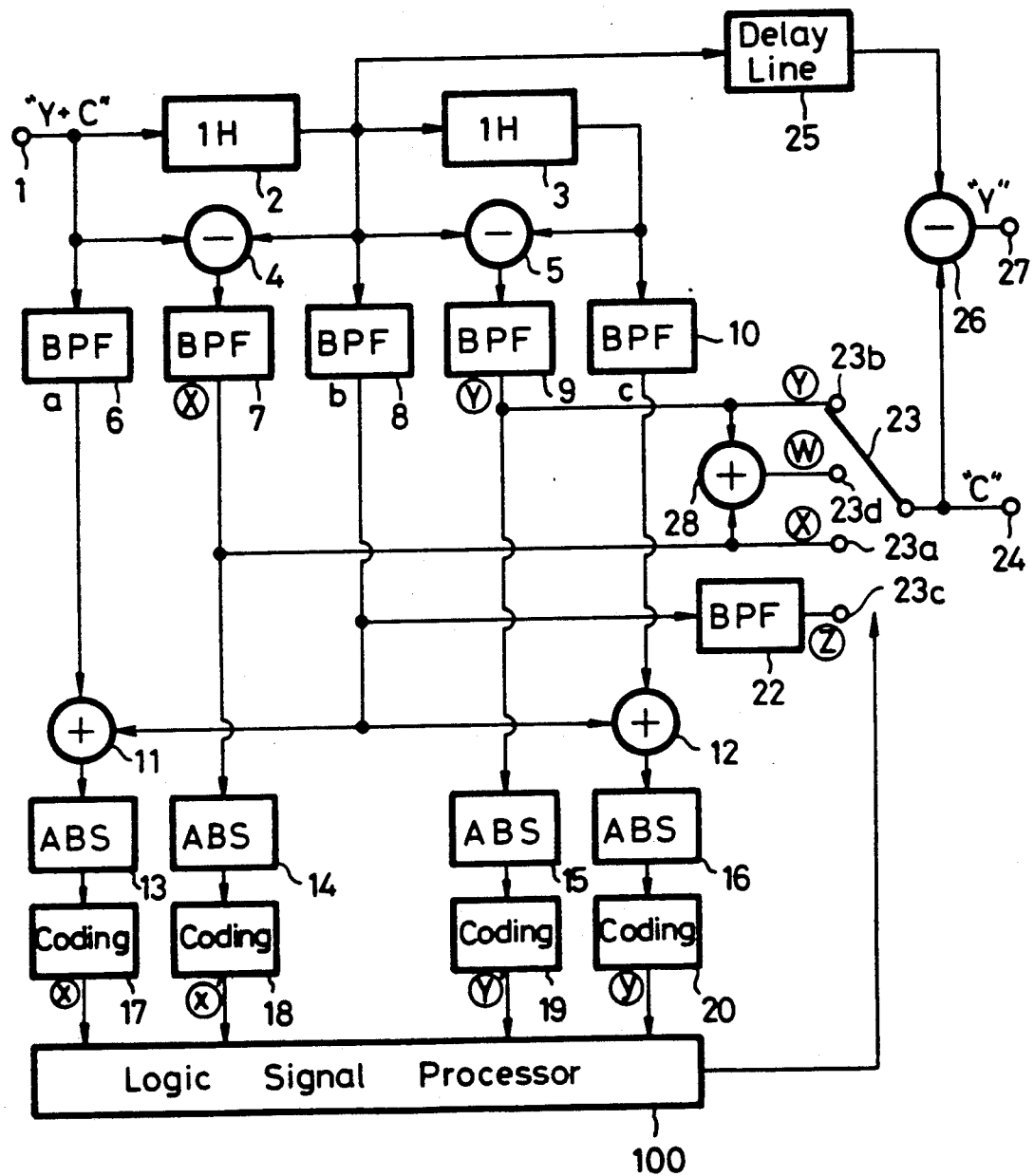
FIG. 7 is a circuit block diagram illustrating a further example of a prior art comb filter for separating luminance and chrominance components of an NTSC composite color video signal.
Figure 8:
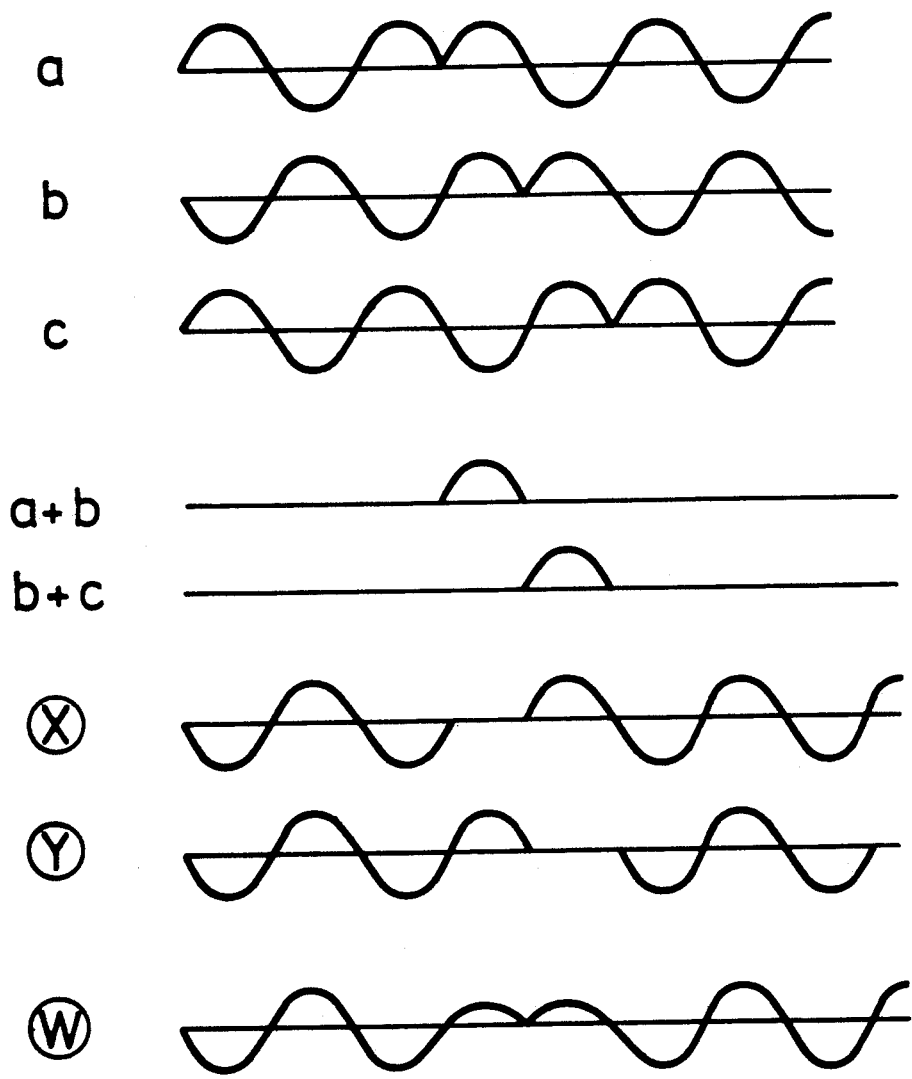
FIG. 8 is a waveform diagram of signals appearing at respective terminals of the prior art comb filter illustrated in FIG. 7 supplied with an input composite color video signal in which the phase of a chrominance component thereof is inverted in successive scan lines by successive intervals of a half of a color subcarrier wavelength.
Figure 9:
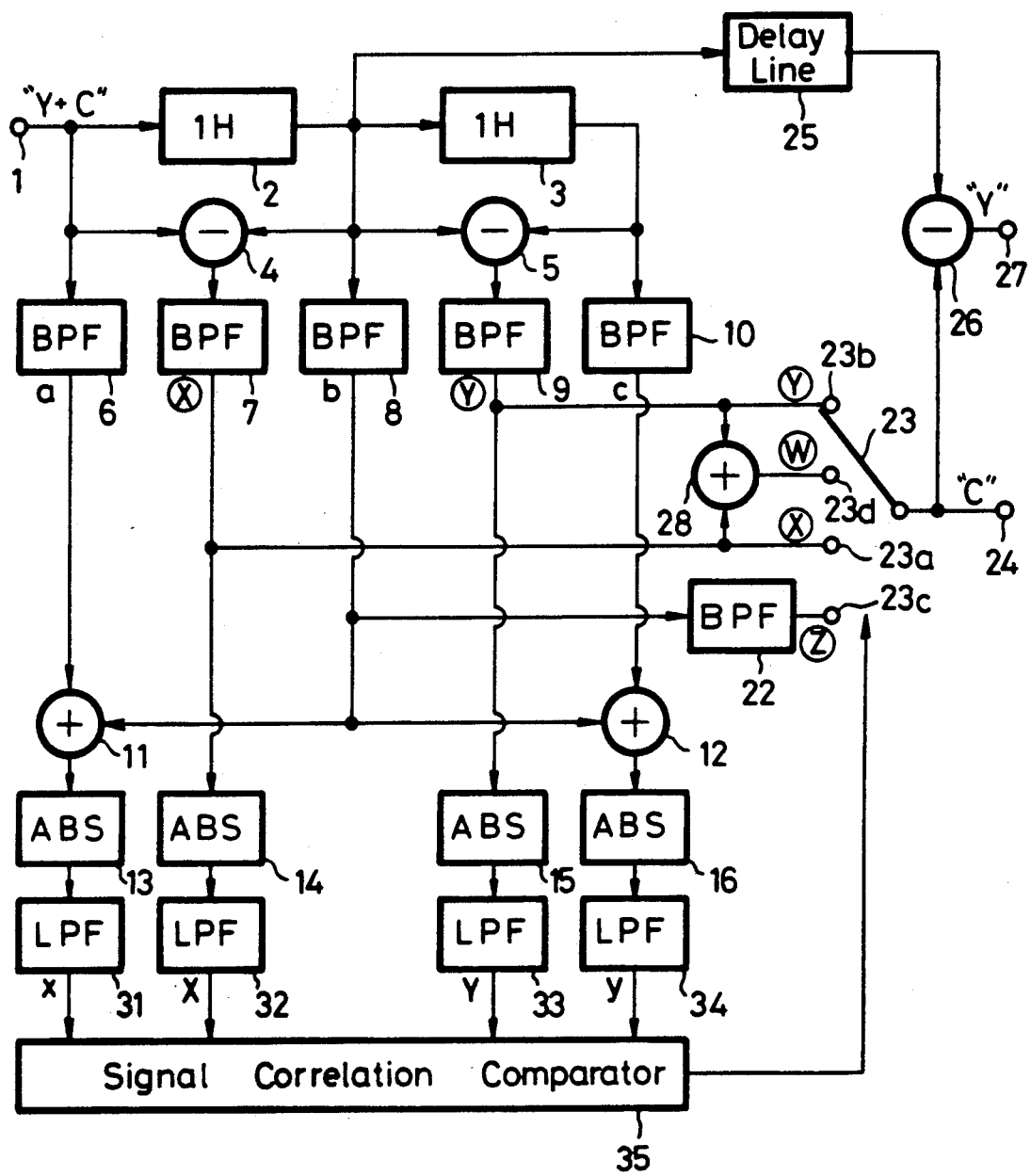
FIG. 9 is a circuit block diagram illustrating a first embodiment of an adaptive comb filter in accordance with the present invention for separating the luminance and chrominance signal components of an NTSC composite color video signal.

Referring to the drawings in detail, and presently to FIG. 9 thereof, a first embodiment of an adaptive comb filter in accordance with the present invention for separating luminance and chrominance signal components of an NTSC composite color video signal is illustrated therein, wherein circuit elements corresponding to those illustrated in FIG. 7 bear the same references.

In the adaptive comb filter of FIG. 9, first through fourth low pass filters (LPF) 31-34 are each operative to attenuate high frequency components of signals supplied at a respective input terminal thereof and having a filter characteristic selected as:

$$\tfrac{1}{4}(1 + 2Z^{-1} + Z^{-2}) \quad (2)$$

where Z represents the sampling cycle. The output terminals of the absolute value generating circuits 13-16 are each connected to the input terminal of a respective one of the low pass filters 31-34. The low pass filters 31-34 are each operative to produce a respective correlation signal x, X, Y and y at a respective output terminal thereof. Each of the output terminals of the low pass filters 31-34 is connected with an input of a signal correlation comparator 35. The signal correlation comparator 35 is operative to compare the signals x, X, Y and y input thereto for controlling the selection of the input signals, $\widehat{W}$, $\widehat{X}$, $\widehat{Y}$ and $\widehat{Z}$ by the switching circuit 23. To do so, the correlation comparator 35 compares the relative magnitudes of the correlation signals x, X, Y, and y and determines the selection of the input to the switching circuit 23 in accordance with the relationships of the input correlation signals set forth in the left-hand column of Table III below.

TABLE III

| Relationship of input correlation signals | Selection of input signals by switching circuit 23 |
|---|---|
| y > 2x | $\widehat{X}$ |
| y < ½x | $\widehat{Y}$ |
| ½y ≤ x ≤ 2y and ½Y ≤ X ≤ 2Y and x, y, X, Y ≠ 0 and X < 2x and Y < 2y | $\widehat{Z}$ |
| Cases other than those described above | $\widehat{W}$ |

It has been observed that when y>2x, non-correlation frequently exists between the signals b and c; accordingly, as indicated in Table III above, the signal correlation comparator 35 is then operative to control the switching circuit 23 to select the input signal $\widehat{X}$. Furthermore, it has been observed that when y is <½x, non-correlation frequently exists between the signals a and b; accordingly, as indicated in Table III above, in these circumstances the signal correlation comparator 35 is operative to control the switching circuit 23 to select the input signal $\widehat{Y}$.

It has been observed that when ½y≤x≤2y and ½Y≤X≤2Y, generally the chrominance signal exists only on one scanning line. In that case, when in addition the correlation signals x, Y, X and Y≠0 and X<2x and Y<2y which ensures a sufficient signal level, the signal $\widehat{Z}$ is selected by the switching circuit 23 under the control of the signal correlation comparator 35. In all other cases, it is found that the correlation of the input signal is sufficiently high, so that the signal $\widehat{W}$ is selected.

Since the signal correlation comparator 35 compares the relative magnitudes of the correlation signals x, X, Y and y for determining whether non-correlation exists therebetween, this determination is unaffected by a change in the absolute levels of the correlation signals, thus enabling the adaptive comb filter of the FIG. 9 embodiment to reliably separate the luminance and chrominance signal components "Y" and "C" despite such variations in signal levels.

Figure 10:
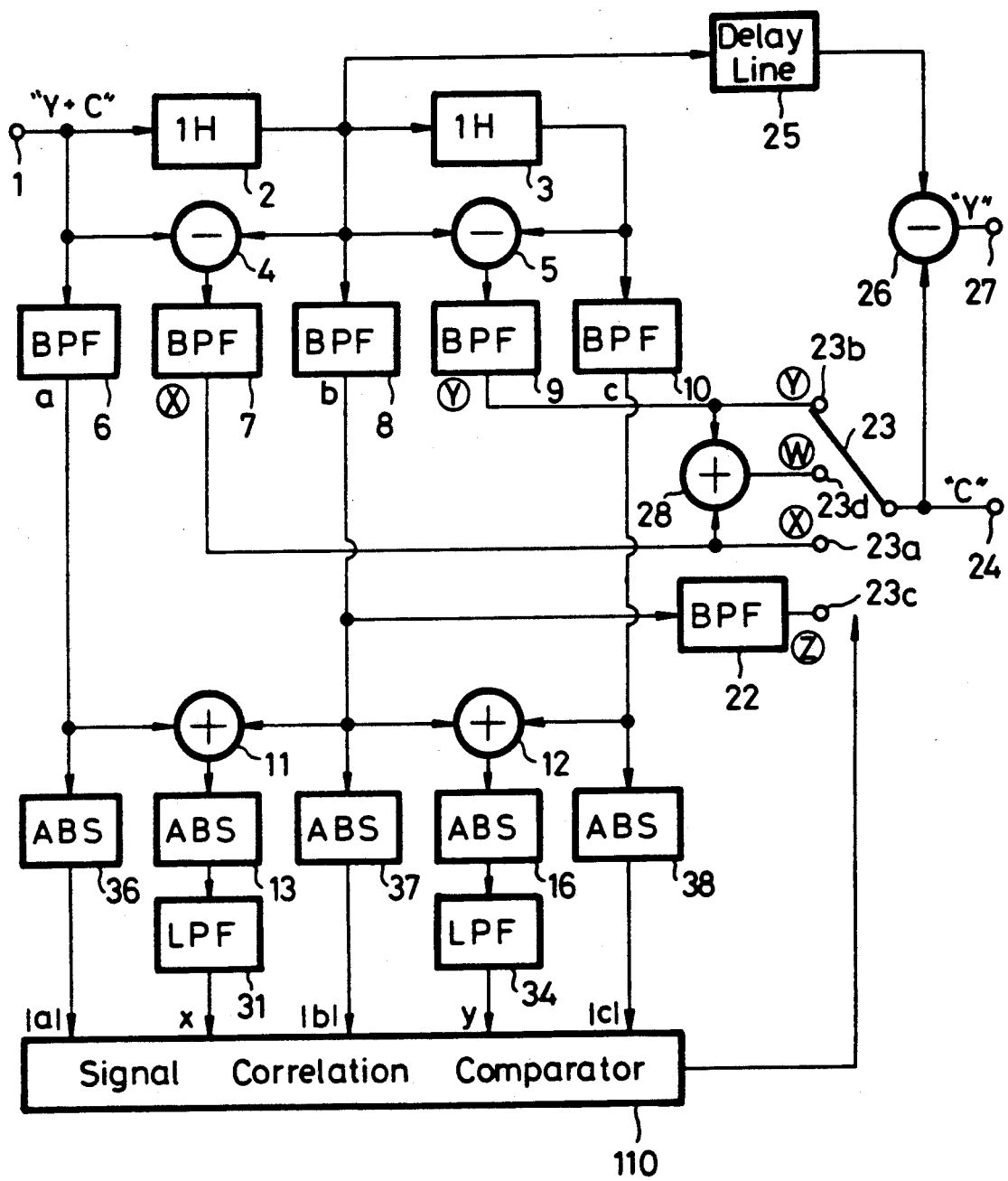
FIG. 10 is a circuit block diagram illustrating a second embodiment of an adaptive comb filter in accordance with the present invention for separating luminance and chrominance signal components of an NTSC composite color video signal.

Referring now to FIG. 10, a second embodiment of an adaptive comb filter in accordance with the present invention is illustrated thereby, wherein circuit elements corresponding with those illustrated in FIG. 9 bear the same references.

In the adaptive comb filter of the FIG. 10 embodiment, absolute value generating circuits 36, 37 and 38 are each operative to produce signals at a respective output terminal thereof proportional to the absolute value of corresponding signals received at a respective input terminal thereof. The input of the absolute value generating circuit 36 is connected with the output terminal of the band pass filter 6 to receive the signal "a" therefrom and provides an absolute value signal a at its output terminal which is connected to an input of a signal correlation comparator 110. The input of absolute value generating circuit 37 is connected with the output of band pass filter 8 to receive the signal "b" therefrom and provides an absolute value signal |b| at its output terminal which is connected to a further input of the signal correlation comparator 110. The input of the absolute value generating circuit 38 is connected to the output terminal of the band pass filter 10 to receive the signal "c" therefrom and provides an output signal |c| at its output terminal which is connected to a further input of the signal correlation comparator 110. The signal correlation comparator 110 is operative to control the selection of the input signals Ⓦ, Ⓧ, Ⓨ and Ⓩ by the switching circuit 23 based upon the signals x, y, |a|, |b| and |c| to effect the selection of the input signals by the switching circuit 23 in accordance with the input correlation signal relationships expressed in the left-hand column of Table IV below.

TABLE IV

| Relationship of input correlation signals | Selection of input signals by switching circuit 23 |
|---|---|
| y > 2x | Ⓧ |
| y < ½x | Ⓨ |
| ½y ≦ x ≦ 2y | |
| \|a\| + \|c\| < ½\|b\| | Ⓩ |
| In other cases | Ⓦ |

As in the case of the FIG. 9 embodiment, the adaptive comb filter of FIG. 10 is operative to select the signal Ⓧ as the output chrominance signal component "C" whenever y>2x and is operative to select the signal Ⓨ as the output chrominance signal whenever y<½x. It has been observed that when ½y≦x≦2y either the signal correlation is higher than a pre-determined level or else non-correlation exists. Under these conditions, it has been observed that when |a|+|c|≦|b|, the chrominance signal generally exists only on one scanning line, that is, at the output of band pass filter 8. In accordance with this observation, and in order to minimize the effects of signal noise, the signal correlation comparator 110 is operative to cause the switching circuit 23 to select the input signal Ⓩ when both ½y≦x≦2y and |a|+|c|≦½|b|. In all other cases, when the signal correlation exceeds a pre-determined level, that is, when ½y≦x≦2y, the signal Ⓦ is selected by the switching 23 circuit under the control of the signal correlation comparator 110.

As in the case of the FIG. 9 embodiment, the adaptive comb filter of FIG. 10 is capable of providing reliable separation of luminance and chrominance signal components from the input composite color video signal despite changes in the absolute levels of the input video signal, since the signal correlation comparator 110 compares the relationship of the absolute values of the signals a, b and c. In addition, since the selection of the band pass filtered chrominance signal Ⓩ is conditioned upon the relationship |a|+|c|≦½|b|, the probability that the adaptive comb filter of the FIG. 10 embodiment will erroneously select the band pass filtered signal Ⓩ due to noise is substantially reduced. Accordingly, it is unnecessary to provide low pass filtering circuitry for removing noise from the output signals provided by the absolute value generating circuits 36, 37 and 38 in the FIG. 10 embodiment, so that the circuitry thereof can be considerably simplified.

Figure 11:
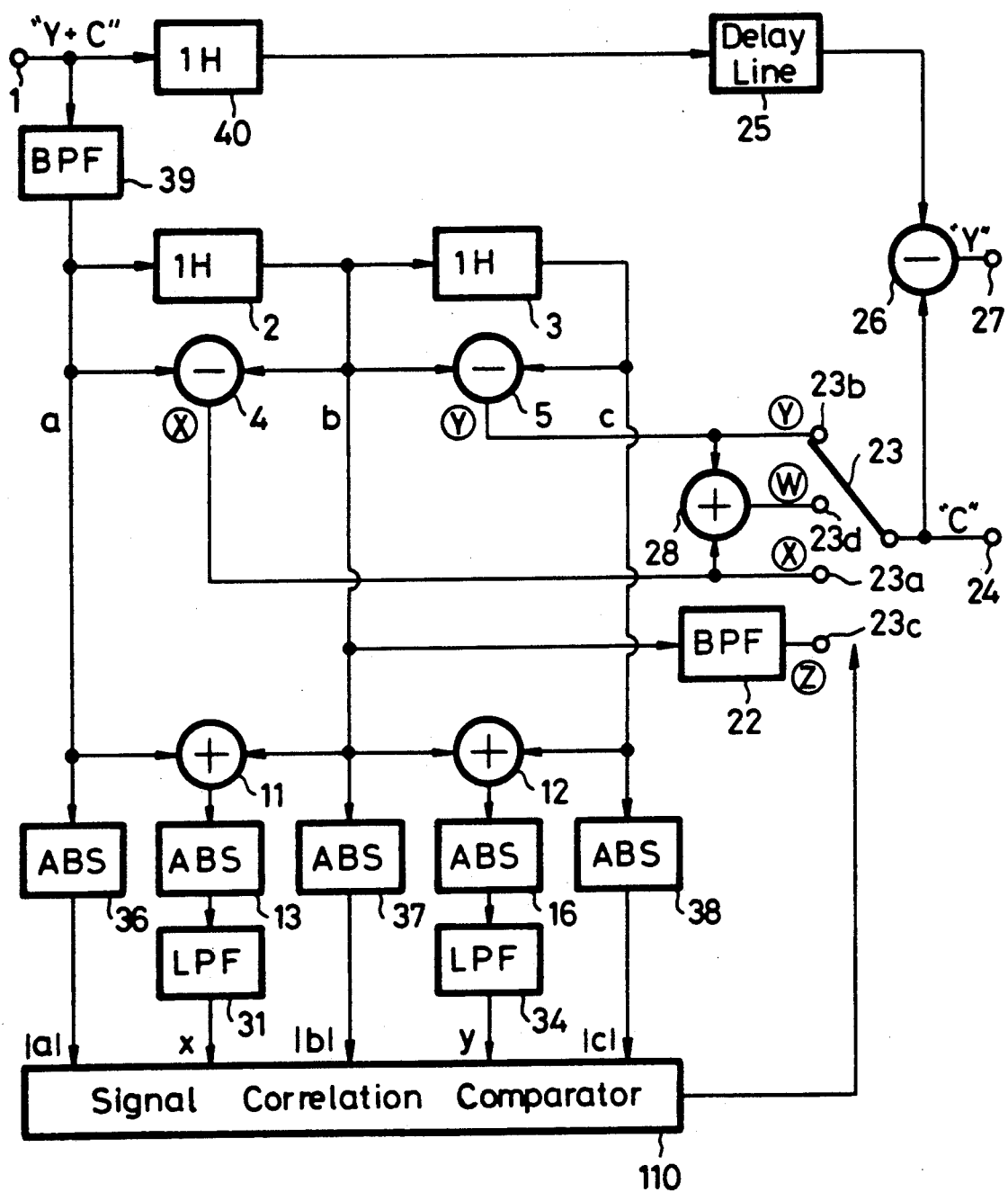
FIG. 11 is a circuit block diagram illustrating a third embodiment of an adaptive comb filter in accordance with the present invention for separating luminance and chrominance signal components of an NTSC composite color video signal.

With reference now to FIG. 11, a third embodiment of an adaptive comb filter in accordance with the present invention is illustrated thereby, wherein circuit elements corresponding with those of the FIG. 10 embodiment bear the same references.

In the embodiment of FIG. 11, the band pass filters 6–10 have been eliminated and in place thereof a single band pass filter 39 is utilized having the same characteristics as those of the band pass filters 6–10 of the FIG. 10 embodiment. An input terminal of the band pass filter 39 is connected with the input terminal 1 and an output terminal thereof is connected with respective inputs of the first delay line 2, first subtracting circuit 4 and first adding circuit 11 to supply the band pass filtered composite color video signal "a" thereto. Since the luminance signal components of the signal provided at the output terminal of the first delay line 2 have been largely eliminated by the band pass filter 39, a further delay line 40 operative to delay signals received at an input terminal thereof by one horizontal line period is provided in the FIG. 11 embodiment to provide the one horizontal line period delay of the composite color video signal "Y+C" provided by the first delay line 2 in the preceding embodiments. Accordingly, the input of the further delay line 40 is connected with the input terminal 1 to receive the composite color video signal "Y+C" and an output terminal thereof is connected with the input of the delay line 25. It will be appreciated that the adaptive comb filter of FIG. 11 is further simplified with respect to that of FIG. 10.

Figures 12, 12A:
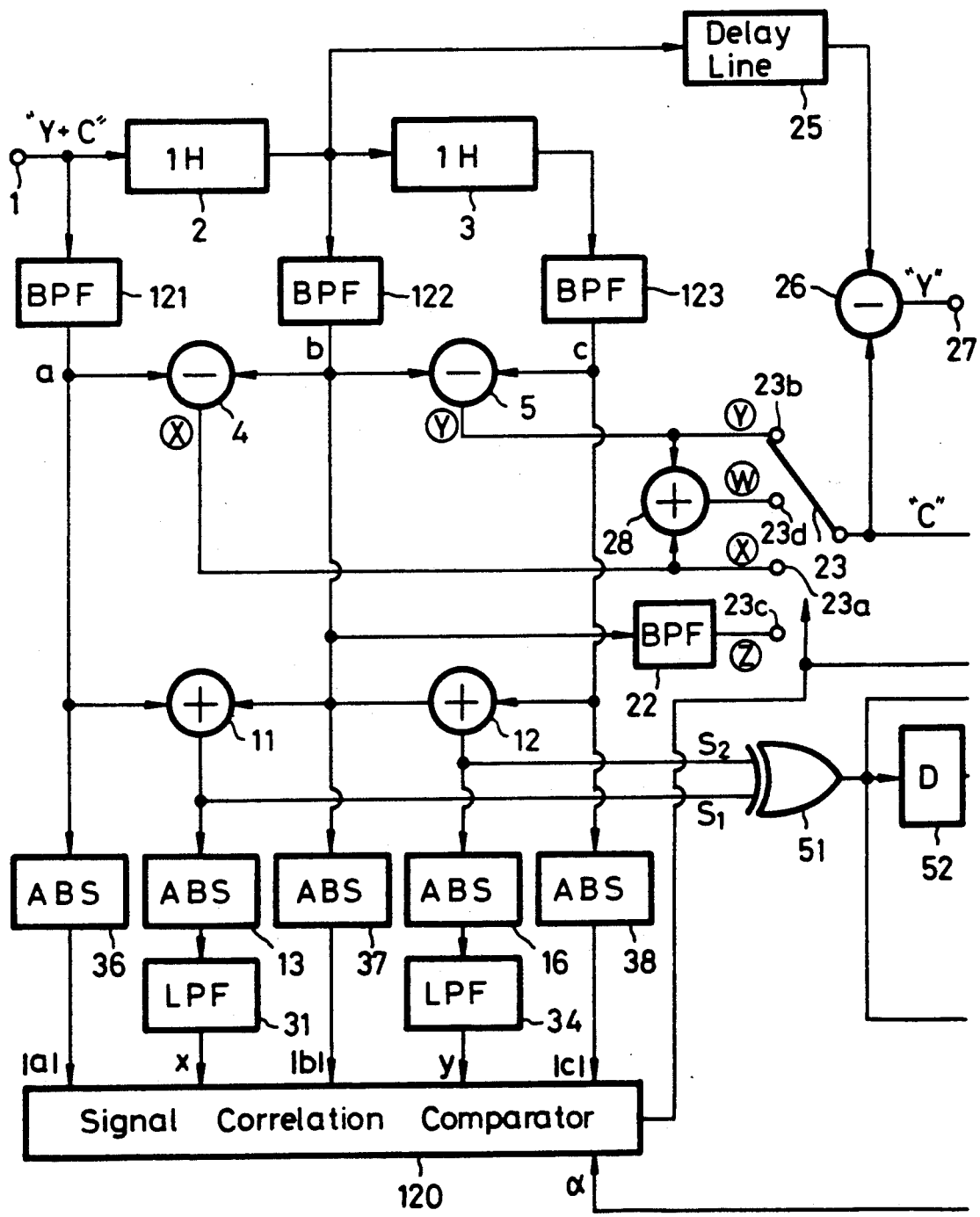
FIG. 12 is a guide for viewing FIGS. 12A and 12B together.
FIGS. 12A and 12B together provide a circuit block diagram illustrating a fourth embodiment of an adaptive comb filter in accordance with the present invention for separating luminance and chrominance signal components of an NTSC composite color video signal.
Figure 12B:
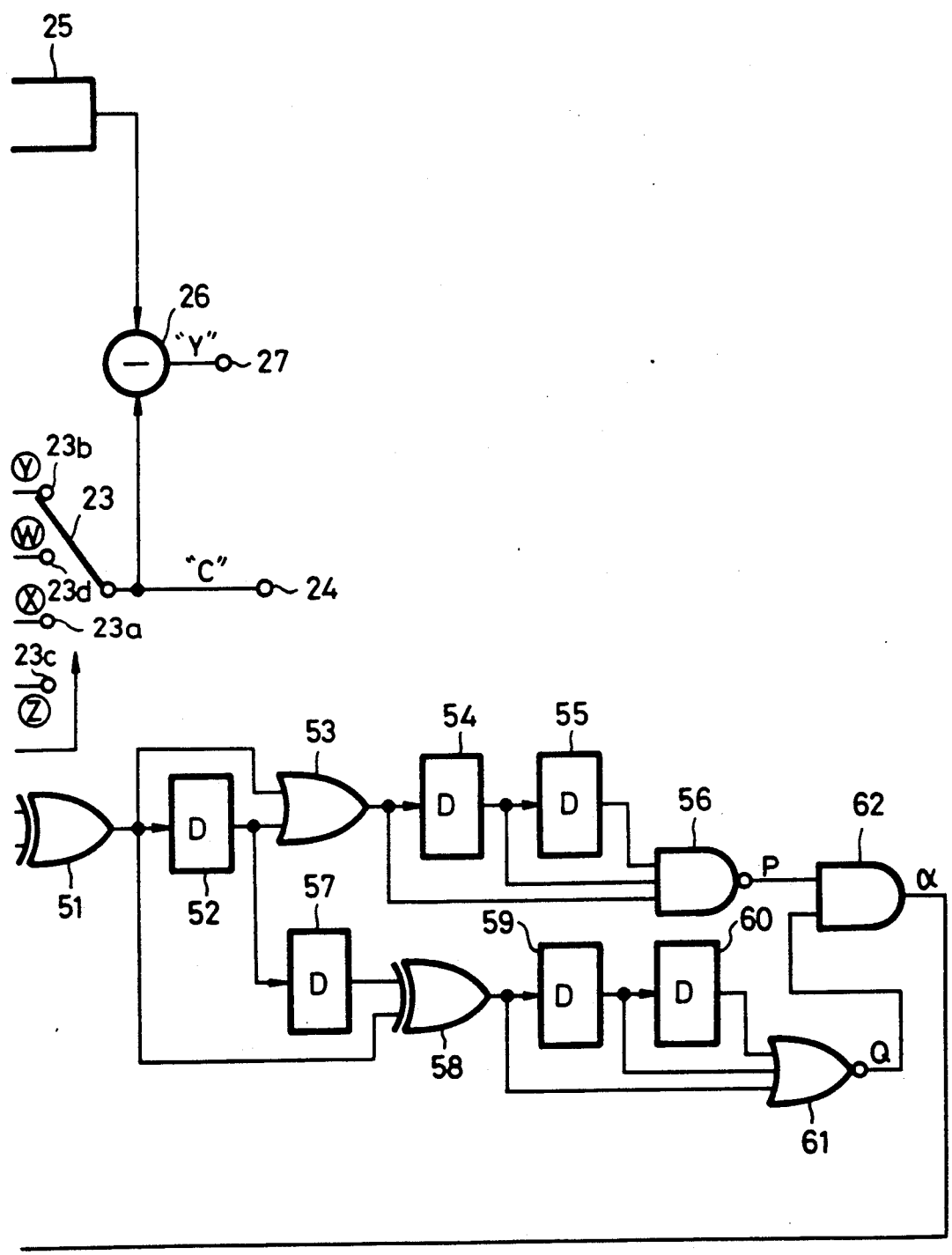

Referring to FIG. 12A and 12B, a fourth embodiment of an adaptive comb filter in accordance with the present invention is illustrated thereby, wherein circuit elements corresponding with those of the embodiments of FIGS. 9, 10 and 11 bear the same references.

In the embodiment illustrated in FIGS. 12A and 12B band pass filters 121, 122 and 123 having the same characteristics as band pass filters 6–10 of the FIG. 10 embodiment are provided. An input of band pass filter 121 is connected with the input terminal 1 and an output terminal thereof is connected with a respective input terminal of each of the first signal subtracting circuit 4, the first adding circuit 11 and the absolute value circuit 36. The input of band pass filter 122 is connected with the output terminal of the first delay line 2 and an output terminal thereof is connected with a respective input terminal of each of the first and second subtracting circuits 4 and 5, the first and second adding circuits 11 and 12 and the absolute value circuit 37. The input of band pass filter 123 is connected with the output terminal of the second delay line 3 and an output terminal thereof is connected with respective inputs of each of the second signal subtracting circuit 5, the second adding circuit 12 and the absolute value circuit 38.

The embodiment of FIGS. 12A and 12B also includes a horizontal correlation detecting logic circuit which is operative to detect horizontal correlation of luminance signal components present in the chrominance signal frequency band of the composite color video signal "Y+C". The horizontal correlation detecting logic circuit includes an exclusive-OR gate 51 having a first input $S_1$ connected to the output terminal of the first adding circuit 11 and a second input $S_2$ connected with the output terminal of the second adding circuit 12. An output terminal of the exclusive-OR gate 51 is connected to an input of a one sample cycle delay circuit (D) 52. An output terminal of the delay circuit 52 is connected with an input terminal of an OR gate 53 and the input of the delay circuit 52 is connected with a second input of the OR gate 53. An output terminal of the OR gate 53 is connected with an input of a further delay circuit (D) 54 which also provides a one sampling cycle delay and an output terminal of the delay circuit 54 is connected to an input of a still further delay circuit (D) 55 providing a further one sampling cycle delay. A NAND gate 56 having three inputs is provided such that its first input is connected to the output terminal of the OR gate 53, its second input is connected to the output terminal of the delay circuit 54 and its third input is connected to the output terminal of the delay circuit 55.

The output terminal of the delay circuit 52 is also connected with an input of another delay circuit 57 which provides a one sampling cycle delay and has an output terminal connected with an input terminal of an exclusive-OR gate 58. The second input of the exclusive-OR gate 58 is connected to the input of the delay circuit 52. Still another delay circuit (D) 59 providing a one sampling cycle delay has an input connected with the output terminal of the exclusive-OR gate 58 and an output terminal connected with an input of yet another delay circuit (D) 60 providing a further one sampling cycle delay. A three input NOR gate 61 has its first input connected with the output terminal of the exclusive-OR gate 58, its second input connected with the output terminal of the delay circuit 59 and its third input connected with an output terminal of the delay circuit 60. A two input AND gate 62 has its first input connected with the output of the NAND gate 56 to receive an output signal P therefrom and its second input connected with the output terminal of the NOR gate 61 to receive an output signal Q therefrom.

The embodiment of FIGS. 12A and 12B further includes a signal correlation comparator 120 having inputs each connected with a respective one of the output terminals of the low pass filters 31 and 34 and of the absolute value generating circuits 36, 37 and 38 to receive the signals x, y, $|a|$, $|b|$ and $|c|$, respectively, therefrom. The signal correlation comparator 120 has a further input connected with an output terminal of the AND gate 62 to receive an output signal $\alpha$ therefrom. The signal correlation comparator 120 is operative to control the selection of the input signals Ⓦ, Ⓧ, Ⓨ and Ⓩ by the switching circuit 23 in accordance with the correlation signal relationships expressed in the left-hand column of Table V below.

TABLE V

| Relationship of input correlation signals | Selection of input signals by switching circuit 23 |
|---|---|
| $y > 2x$ | Ⓧ |
| $y < \frac{1}{2}x$ | Ⓨ |
| $\frac{1}{2}y \leq x \leq 2y$ |  |
| $|a| + |c| < \frac{1}{2}|b|$ and $\alpha = 1$ | Ⓩ |
| In other cases | Ⓦ |

With reference to Table V, in the embodiment of FIGS. 12A and 12B, like that of FIG. 10, the signal correlation comparator 120 is operative to control the switching circuit 23 to select the input signal Ⓧ when $y > 2x$, and is operative to control the switching circuit 23 to select the signal Ⓨ when $y < \frac{1}{2}x$. When either the correlation is higher than the pre-determined level or non-correlation exists, such that $\frac{1}{2}y \leq x \leq 2y$, the signal correlation comparator 120 controls the switching circuit 23 to select either the signal Ⓩ or the signal Ⓦ. As in the case of the FIG. 10 embodiment, a condition for the selection of the signal Ⓩ is that $|a| + |c| < \frac{1}{2}|b|$, indicating generally that the chrominance signal exists only at the output of the band pass filter 122. The second condition for the selection of the signal Ⓩ is that $\alpha = 1$ indicating the absence of horizontal correlation, which is explained below in connection with the examples of FIGS. 13 and 14.

With reference now to FIG. 13, waveforms a, b and c represent signals appearing at the output terminals of band pass filters 121, 122 and 123, respectively, to illustrate luminance signal components having a frequency of approximately 3.58 MHz. Under these conditions, the signals $a + b$ (supplied to input $S_1$ of exclusive-OR gate 51) and $b + c$ (supplied to input $S_2$ of exclusive-OR gate 51) output respectively by the first and second adding circuits 11 and 12 will appear as shown in FIG. 13. The signals $S_1$ and $S_2$ are sampled at the points indicated by the cross marks superimposed on their illustrated waveforms, so that the output $S_1 \oplus S_2$ of the exclusive-OR circuit 51 will have the logic values indicated in FIG. 13 beneath the waveform $S_2$ in correspondence with each pair of sampling points. Since the output of the exclusive-OR gate 51 alternates between logic "1" and "0" levels with each successive sampling interval, the output of the OR gate 53 remains at a logic "1" level so long as the signals a, b and c continue as shown in FIG. 13. Accordingly, the output P of NAND gate 56 at the same time will remain at a logic "0" level.

Figure 14:
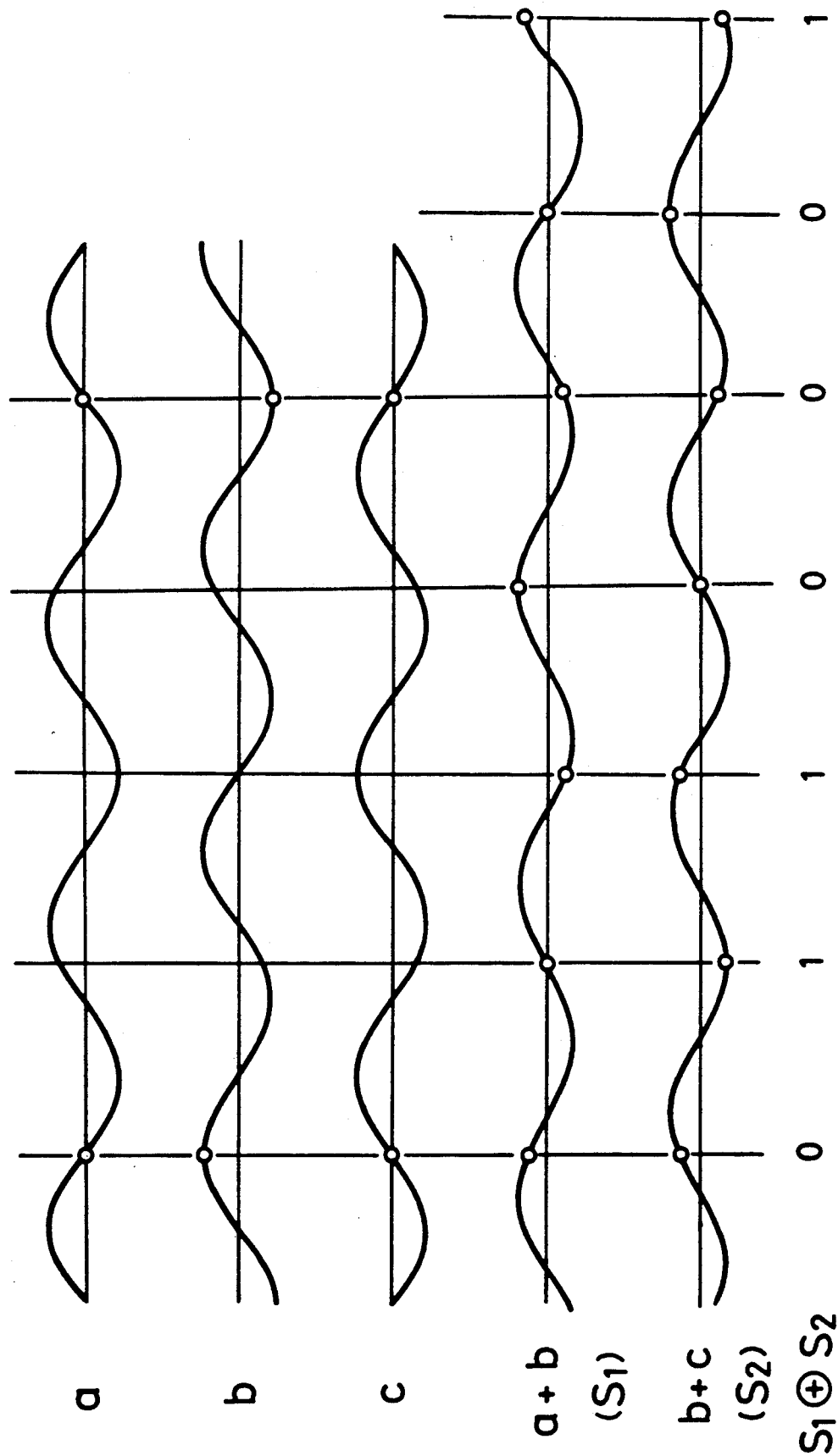
FIG. 14 is a waveform diagram of signals appearing at respective terminals of the adaptive comb filter illustrated in FIGS. 12A and 12B supplied with a luminance signal of approximately 6 MHz, and to which reference is made in explaining the operation of the adaptive comb filter illustrated in FIGS. 12A and 12B.

Referring to FIG. 14, the waveforms a, b and c represent luminance signal components having a frequency of approximately 6 MHz. The signals $S_1$ and $S_2$ corresponding with the outputs $a + b$ and $b + c$, respectively, produced by the second and third adding circuits 11 and 12 are illustrated in FIG. 14 wherein signal sampling points are represented by open circles superimposed on the waveforms of the signals $S_1$ and $S_2$. The $S_1$ and $S_2$ signal waveforms of FIG. 14 represent logic "0" levels at points beneath the horizontal axis thereof and represent logic "1" levels at points on or above the horizontal axis. The logic level output $S_1 \oplus S_2$ produced by the exclusive-OR gate 51, accordingly, assumes the values indicated beneath the waveform $S_2$ in correspondence with each pair of the sampled signals $S_1$ and $S_2$. It will be seen from the illustrated values of $S_1 \oplus S_2$ as shown in FIG. 14 that, so long as luminance signal components having the characteristics represented by the waveforms a, b and c as shown in FIG. 14 are provided at the inputs of the second and third adding circuits 11 and 12, the output signal Q from the NOR gate 61 will remain at a logic "0" level.

It will be seen that, under the conditions illustrated in FIGS. 13 and 14, the output signal o provided by the AND gate 62 is maintained at a logic "0" level and, with reference to Table V above, the signal correlation comparator 120 will be operative, under these conditions, to prevent the selection of the signal Ⓩ. Stated differently, the signal Ⓩ is selected only when middle and high band components of the luminance signal, such as sweep signal components and the like, are not sufficiently large to enable their detection by the horizontal correlation detecting logic circuit. Where, however, the condition $\frac{1}{2}y \leq x \leq 2y$ obtains, and either $|a| + |c| \leq \frac{1}{2}|b|$ or $\alpha = 0$, the correlation of the signals is sufficiently high so that the signal Ⓦ is selected by the switch 23 under the control of the signal correlation comparator 120.

Since the adaptive comb filter of FIGS. 12A and 12B requires that the relative magnitudes of the signals a, b and c satisfy the condition $|a| + |c| < \frac{1}{2}|b|$ before the signal correlation comparator 120 thereof will control the switching circuit 23 to select the signal Ⓩ as the output chrominance signal "C", the probability that the signal Ⓩ will be selected erroneously due to noise is substantially reduced. Consequently, it is unnecessary to provide means for removing noise from the signals $|a|$, $|b|$ and $|c|$, such as a low pass filter, so that the adaptive comb filter of FIGS. 12A and 12B can be considerably simplified.

The band pass filters 121, 122 and 123 of the adaptive comb filter embodiment of FIGS. 12A and 12B have relatively wide pass bands ensuring that the frequency bands of the luminance and chrominance signal components transmitted thereby will overlap. Accordingly, in order to increase the resolution of the luminance signal "Y" provided at the output terminal 27 of the adaptive comb filter, the band pass filter 22 is provided with a relatively narrower pass band than that of filters 121–123. Presently, the chrominance signal can be limited to a bandwidth of ±500 kHz while still providing an acceptable image. However, broad band chrominance signals are required for newly developed imaging systems. If the bandwidths of the band pass filters 121, 22 and 123 are broadened accordingly, however, the resolution of the output luminance signal "Y" will deteriorate. In addition, the selection of the signal $\widehat{Z}$ by the switch 23 of the adaptive comb filter of FIGS. 12A and 12B results in a cross color effect which is generally inconspicuous since it occurs relatively infrequently. Nevertheless, it is desirable from an aesthetic viewpoint to provide the greatest possible degree of signal separation.

Figures 15, 15A:
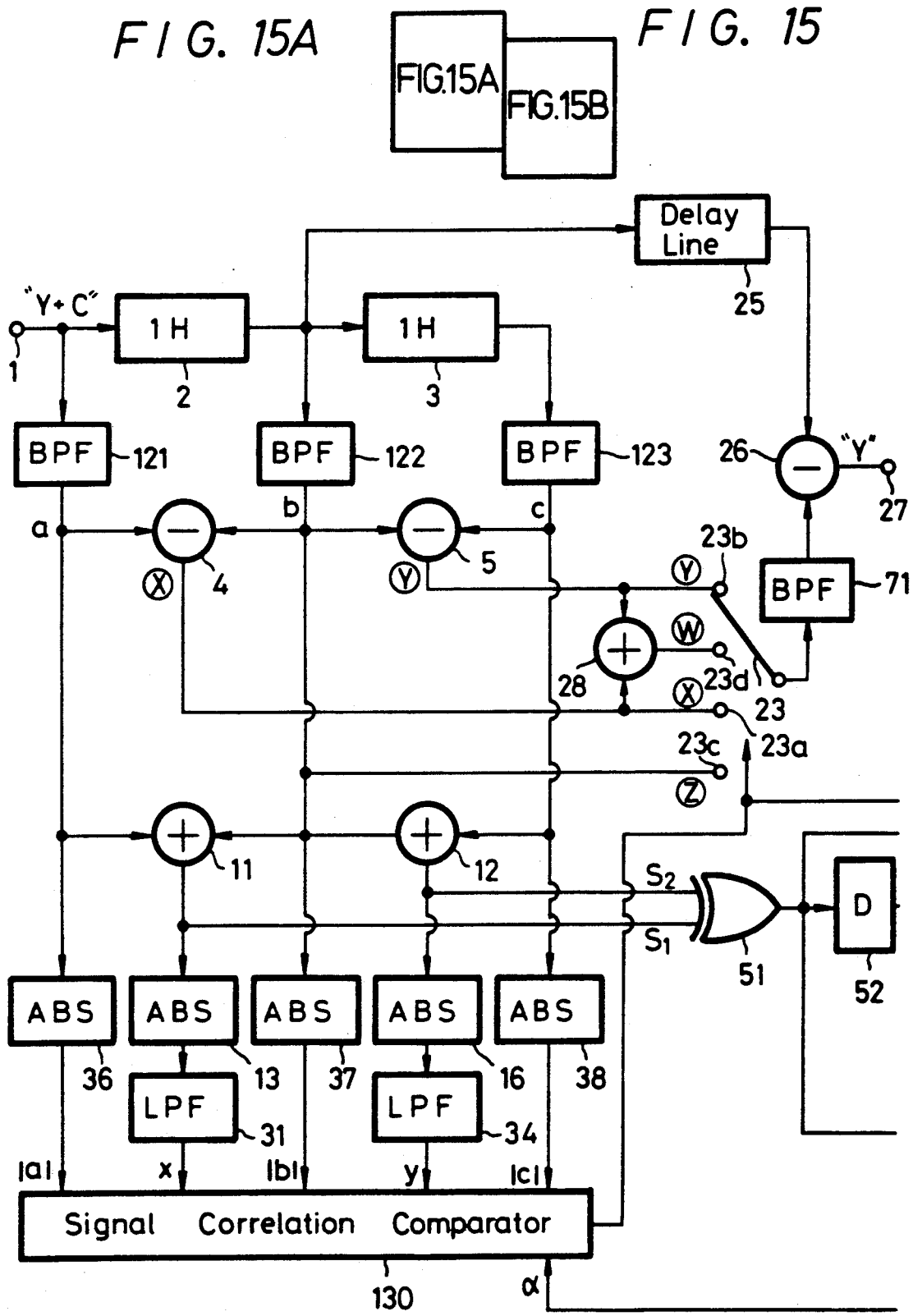
FIG. 15 is a guide for viewing FIGS. 15A and 15B together.
FIGS. 15A and 15B together provide a circuit block diagram illustrating a fifth embodiment of an adaptive comb filter in accordance with the present invention for separating luminance and chrominance signal components of an NTSC composite color video signal.
Figure 15B:
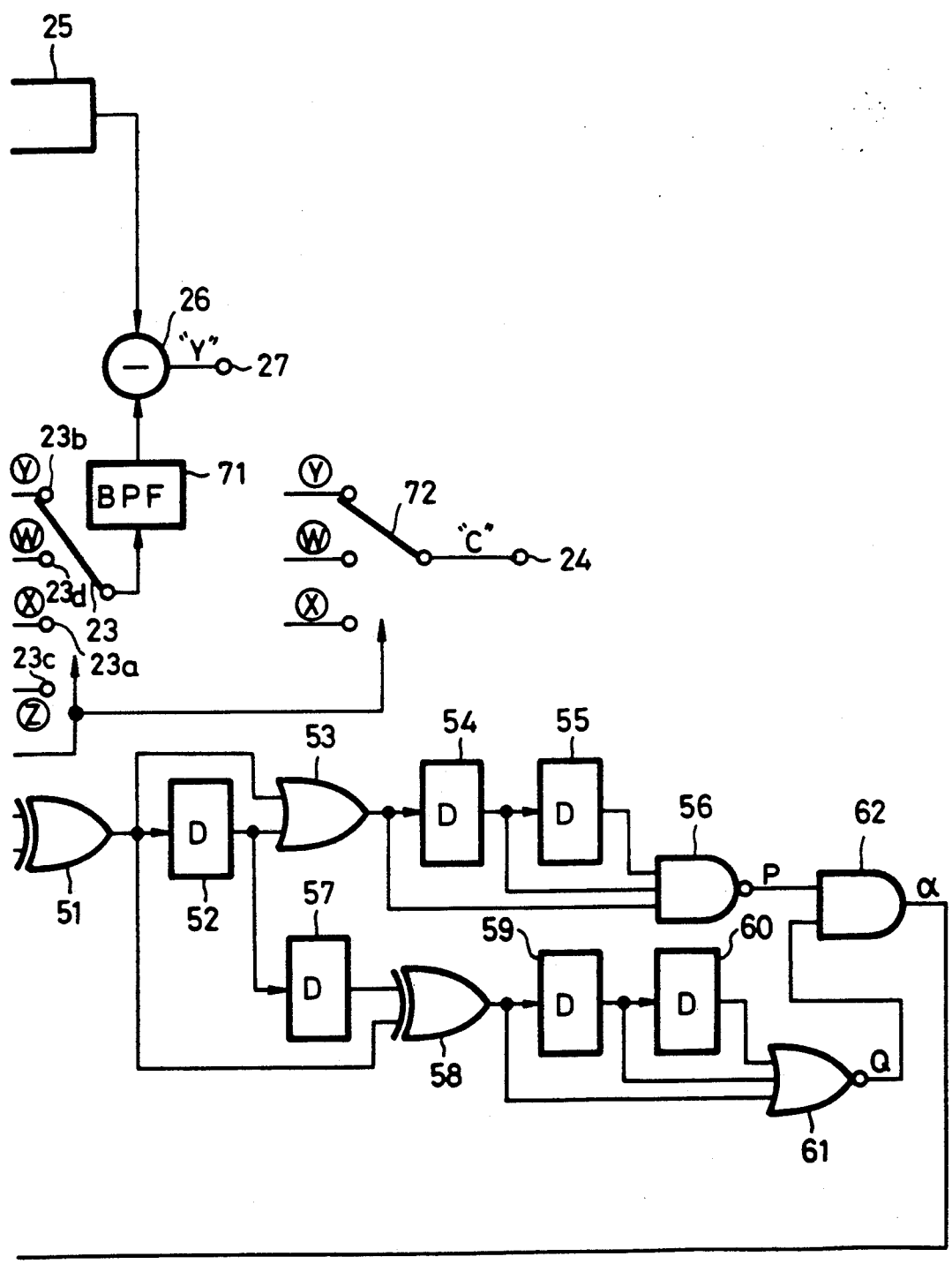

With reference now to FIGS. 15A and 15B, a fifth embodiment of an adaptive comb filter in accordance with the present invention for separating luminance and chrominance signal components of an NTSC composite color video signal is illustrated thereby, wherein the above described shortcomings and disadvantages encountered in the operation of the adaptive comb filter of FIGS. 12A and 12B can be substantially minimized. Circuit elements illustrated in FIGS. 15A and 15B which correspond to those shown in FIGS. 12A and 12B bear the same references.

In the embodiment of FIGS. 15A and 15B, a band pass filter 71 possessing a desirably narrow pass band for improving the resolution of the luminance signal "Y" has an input connected with the output terminal of the switching circuit 23 and an output terminal connected with the second input of the subtracting circuit 26 to provide the separated chrominance signal thereto for producing the luminance signal "Y". Accordingly, the band pass filter 22 is unnecessary in the embodiment of FIGS. 15A and 15B. A further switching circuit 72 is provided in parallel with the switching circuit 23 and has a first input connected with the output terminal of the first subtracting circuit 4 to receive the signal $\widehat{X}$ therefrom, a second input connected to the output terminal of the second subtracting circuit 5 to receive the signal $\widehat{Y}$ therefrom and a third input connected with the output terminal of the third adding circuit 28 to receive the signal $\widehat{W}$ therefrom. The switching circuit 72 has an output terminal connected to the output terminal 24 of the adaptive comb filter circuit to provide the chrominance signal "C" thereto. The switching circuit 72 is operative under the control of a signal correlation comparator 130 to select one of the input signals $\widehat{W}$, $\widehat{X}$ or $\widehat{Y}$ to be output to the output terminal 24 as the output chrominance signal "C". The signal correlation comparator 130 of the embodiment of FIGS. 15A and 15B operates in the same fashion as the signal correlation comparator 120 of the embodiment of FIGS. 12A and 12B, except that when the signal correlation comparator 130 controls the switching circuit 23 to select the input signal $\widehat{Z}$ it simultaneously controls the switching circuit 72 to select the input signal $\widehat{W}$ to be provided as the chrominance signal "C" at the output terminal 24.

It will be seen, therefore, that in the embodiment of FIGS. 15A and 15B the pass band of the band pass filter 71 may be selected to improve the resolution of the luminance signal accordingly without simultaneously narrowing the bandwidth of the chrominance signal provided at the output terminal 24. Therefore, the pass bands of the band pass filters 121, 122 and 123 may then be broadened to accommodate a chrominance signal of broader bandwidth. At the same time, the 2H comb filter output signal $\widehat{W}$ is selected by the switching circuit 72 as the output chrominance signal in lieu of the signal $\widehat{Z}$ to desirably suppress the cross color effect present in the signal $\widehat{Z}$.

Figure 16B:
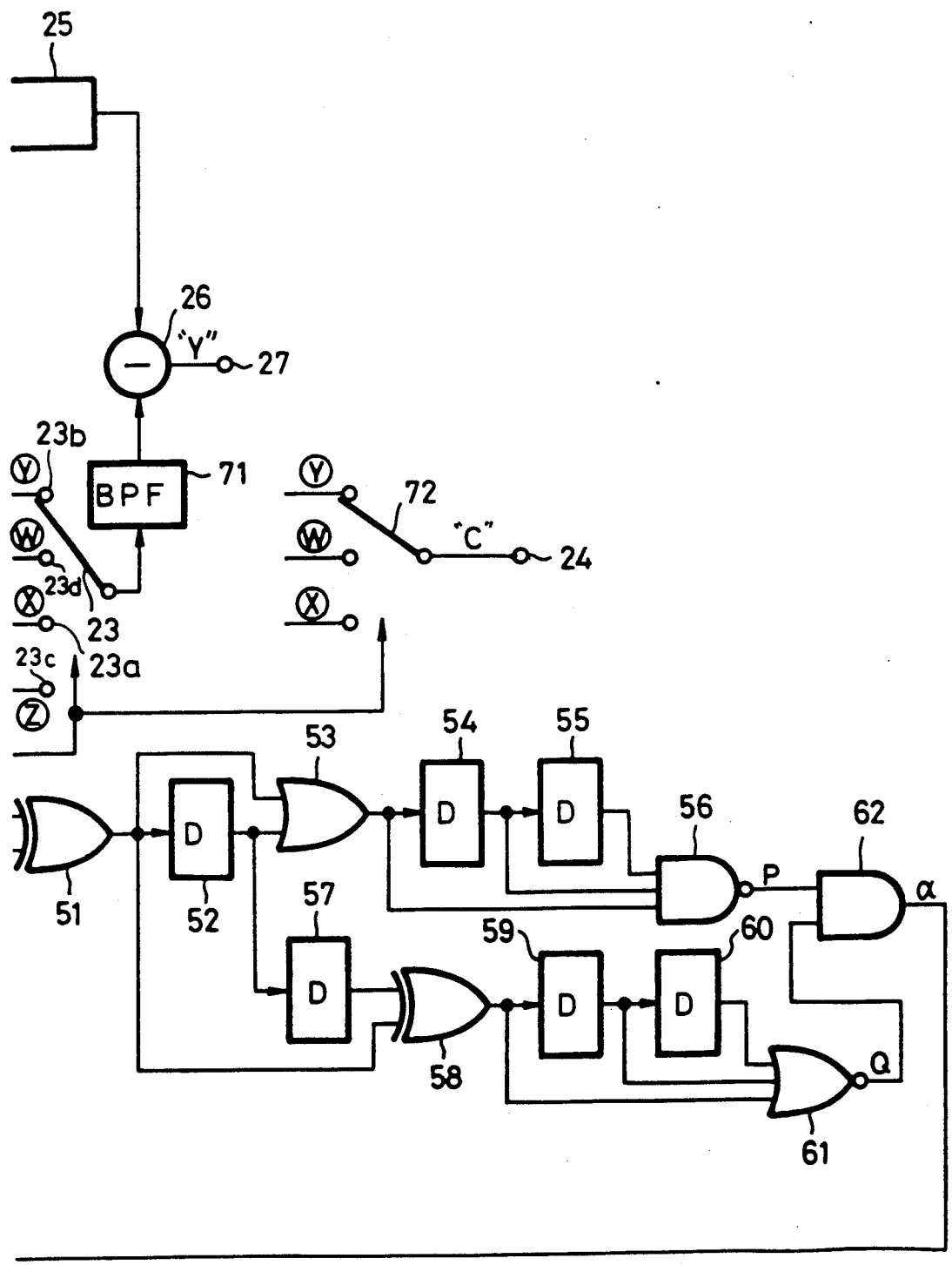

Referring to FIGS. 16A and 16B, a sixth embodiment of an adaptive comb filter in accordance with the present invention for separating luminance and chrominance components of a PAL composite color video signal is illustrated thereby, wherein circuit elements corresponding to those illustrated in FIGS. 15A and 15B bear the same references. It is noted initially that the phases of the chrominance signal components of the PAL composite color video signal differ by 90° from each horizontal line to the next, so that a delay of two horizontal line periods thereof will provide a chrominance signal which is phase inverted with respect to a newly received chrominance signal, provided that the signals exhibit vertical correlation. In the embodiment of FIGS. 16A and 16B, a first pair of signal delay circuits 2a and 2b each provides a signal delay substantially equal to one horizontal line interval. An input of delay circuit 2a is connected with the input terminal 1 and an output terminal thereof is connected with an input of the delay circuit 2b. An output terminal of the delay circuit 2b is connected with the input of the delay line 25 as well as with the input of the band pass filter 122.

A second pair of delay circuits 3a and 3b is provided each serving to delay signals provided at a respective input thereof by one horizontal line interval. An input of the delay circuit 3a is connected with the output terminal of the delay circuit 2b and an output terminal of the delay circuit 3a is connected with an input of the delay circuit 3b. An output terminal of the delay circuit 3b is connected with the input terminal of the band pass filter 123. Accordingly, the first pair of delay Circuits 2a and 2b together serve to delay a PAL composite color video signal received at the input terminal 1 by two horizontal line intervals as the same is provided at the output terminal of the delay circuit 2b. Furthermore, the second pair of delay circuits 3a and 3b is operative to delay the PAL composite color video signal provided at the output terminal of the delay circuit 2b by a further two horizontal line intervals to provide the same at the output terminal of the delay circuit 3b which is thus delayed with respect to the input signal by four horizontal line intervals.

A signal correlation comparator 140 of the adaptive comb filter of FIGS. 16A and 16B serves to compare the values x, y, |a|, |b| and |c| input thereto to determine the selection of an input signal by each of the switching circuits 23 and 72 in accordance with the relationships set forth in Table VI below:

TABLE VI

| Relationship of input correlation signals | Selection of input signals by switching circuits 23 and 72 |
| --- | --- |
| y > 4x | $\widehat{X}$ |

TABLE VI-continued

| Relationship of input correlation signals | Selection of input signals by switching circuits 23 and 72 |
|---|---|
| $y < \frac{1}{4}x$ $\frac{1}{4}y \leq x \leq 4y$ | Ⓨ |
| $|a| + |c| < \frac{1}{4}|b|$ and $\alpha = 1$ | Switch 23 selects signal Ⓩ Switch 72 selects signal Ⓦ |
| In other cases | Ⓦ |

With reference to Table VI, it will be seen that the relative ratios employed by the signal correlation comparator are selected as ¼ and 4, instead of ½ and 2, in order to more effectively eliminate cross color effects in the chrominance signal component of the PAL composite color video signal.

The polarity of the color subcarrier of the PAL composite color video signal differs from that of the NTSC signal. Since the signal correlation comparator 140 compares absolute values of the signals a, b and c, however, modifications need not be made to the signal correlation comparator 130 of the embodiment of FIGS. 15A and 15B to adapt the same for use as the signal correlation comparator 140 of the FIGS. 16A and 16B embodiment specifically to accommodate such polarity differences.

Figure 17:
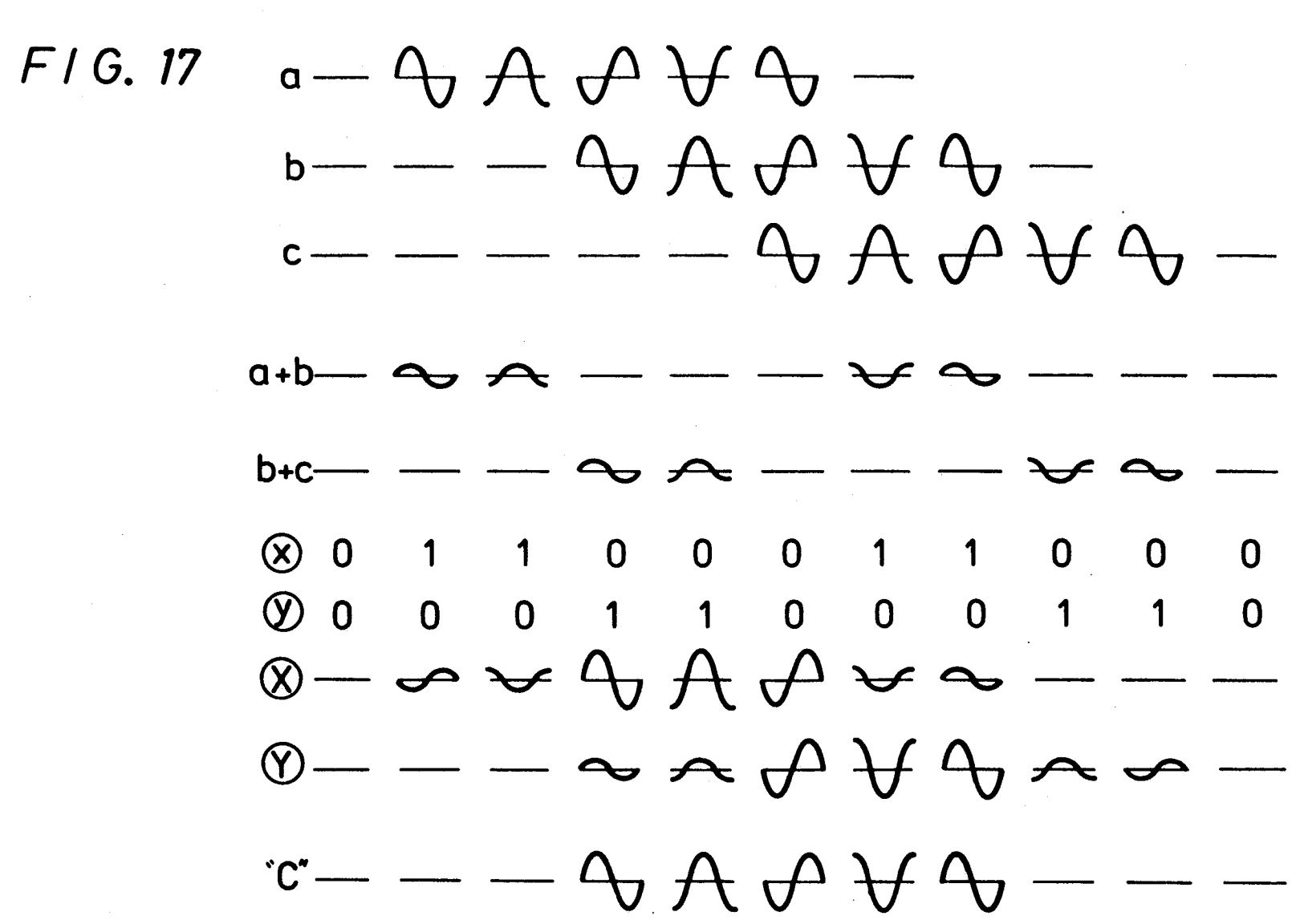

With reference now to FIG. 17, the amplitudes and phases of exemplary output signals from band pass filters 121, 122 and 123, are represented by the waveforms a, b and c, respectively, in the case where a chrominance signal first appears on a given horizontal line of the PAL composite color video signal supplied at the input terminal 1, while the level of the luminance component thereof is constant. With the exception of the logic signals Ⓧ and Ⓨ (described below), the remaining waveforms illustrated in FIG. 17 represent the phases and amplitudes of the correspondingly labelled signals coincident with the signals a, b and c represented therein. It will be seen from FIG. 17 that when such chrominance signal components are applied to only one input of either of the first and second subtracting circuits 4 and 5, their respective output signals Ⓧ or Ⓨ are attenuated with respect to the input signal. Consequently, the selection of either of the signals Ⓧ or Ⓨ without the use of an adaptive comb filtering technique in accordance with the operation of the embodiment of FIGS. 16A and 16B results in a loss of vertical resolution of the image produced with the use of either of the signals Ⓧ or Ⓨ alone. However, the adaptive comb filter of FIGS. 16A and 16B advantageously selects the unattenuated one of signals Ⓧ or Ⓨ under these circumstances such that vertical resolution is thereby improved. The enhanced separation of the chrominance signal component under these conditions likewise results in a reduction of dot interference in the luminance signal component "Y" supplied at the output terminal 27.

Figure 1:
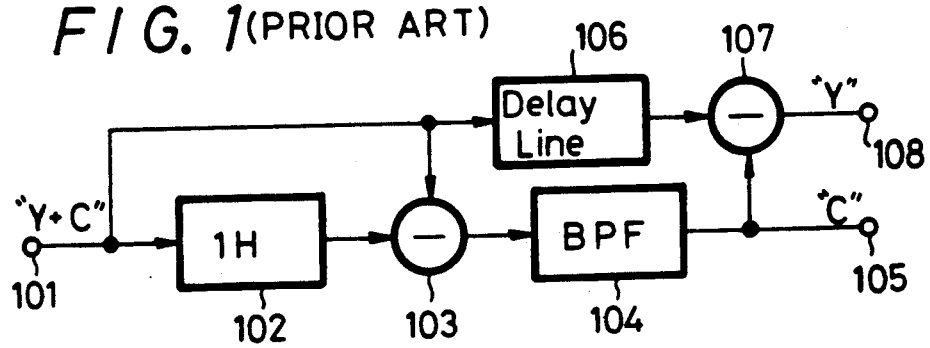
FIG. 1 is a circuit block diagram providing an example of a prior art comb filter for separating luminance and chrominance signal components of an NTSC composite color video signal.
Figure 2:
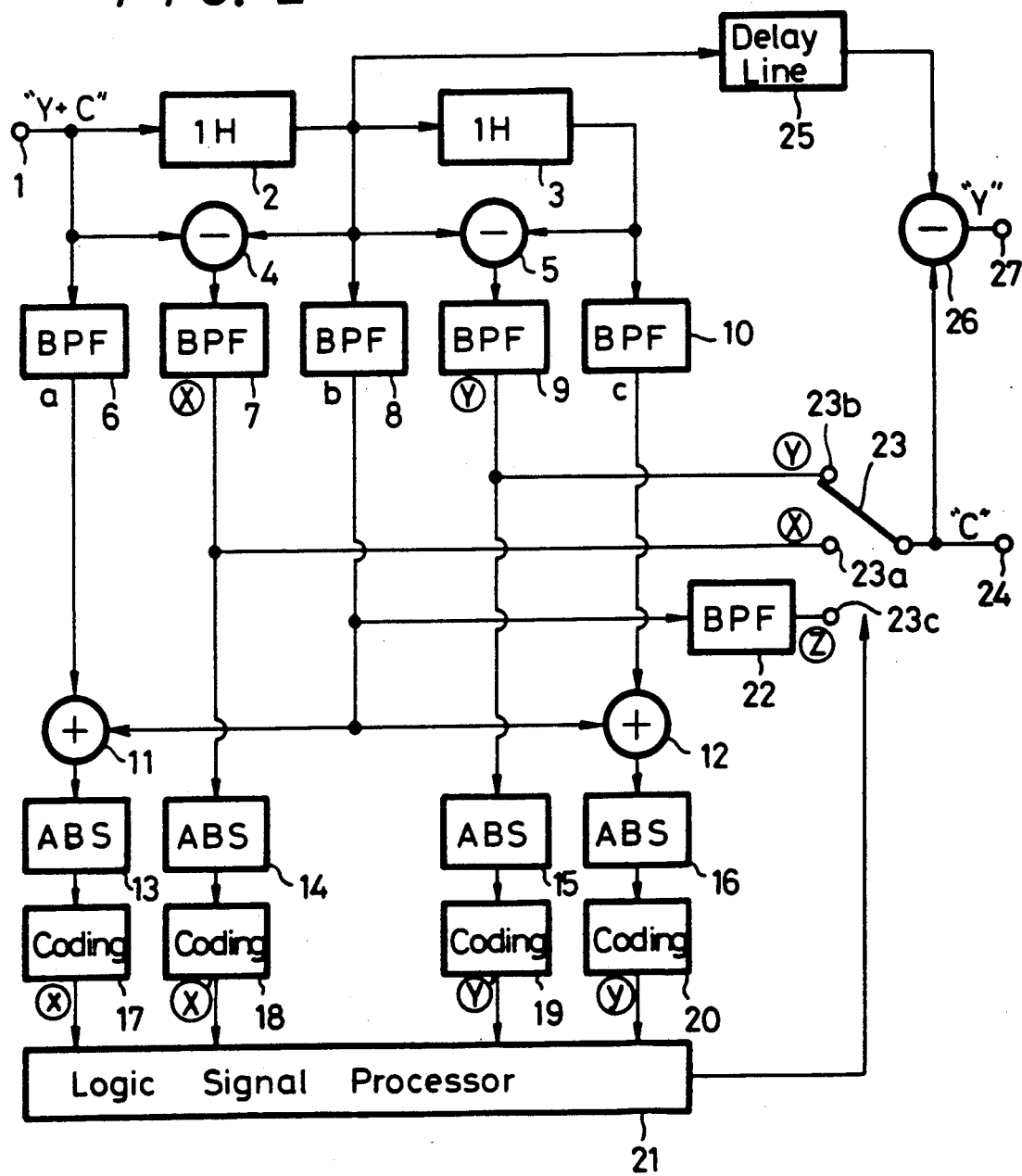
FIG. 2 is a circuit block diagram providing another example of a prior art comb filter for separating luminance and chrominance signal components of an NTSC composite color video signal.
Figure 18:
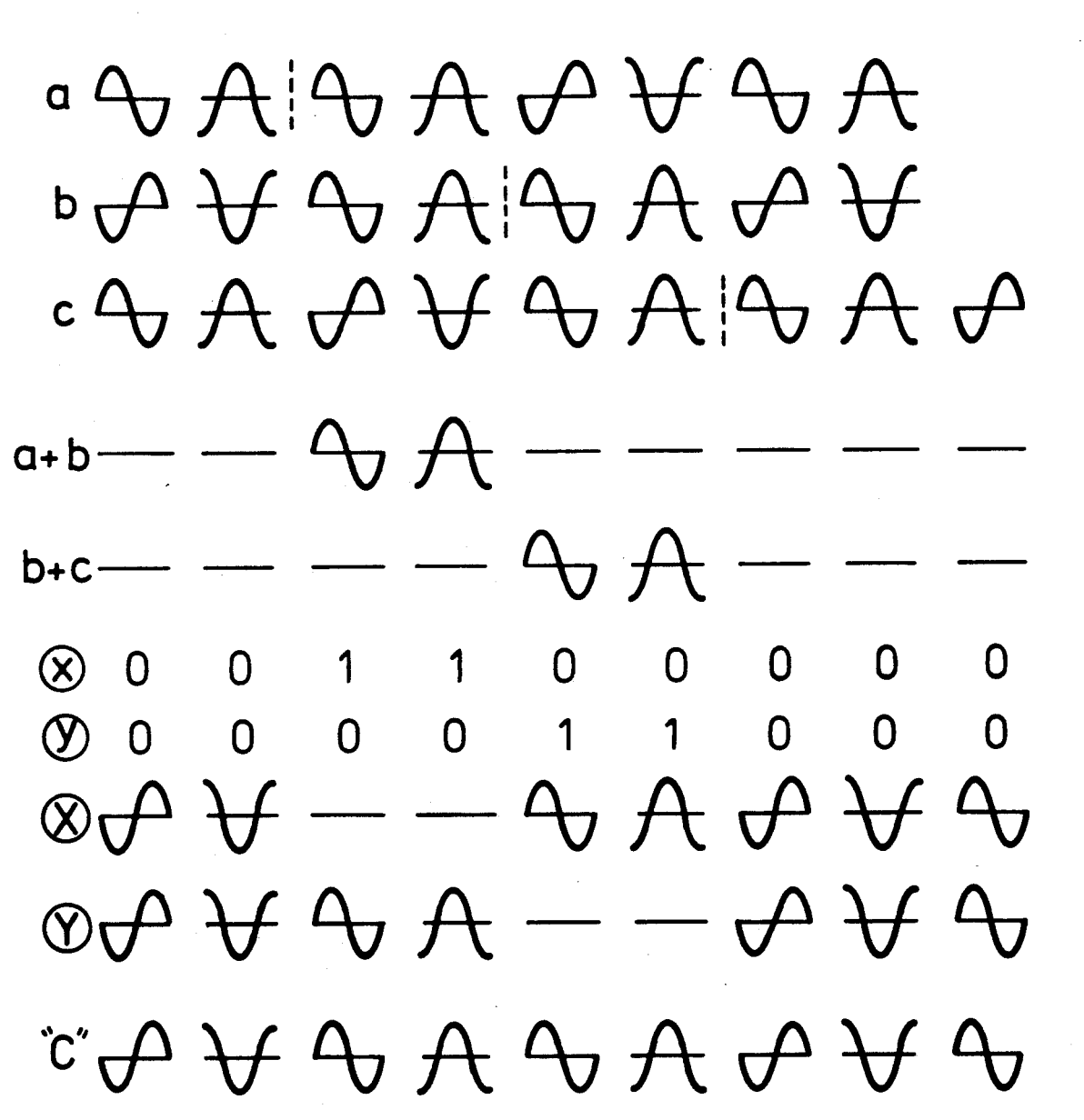

The logic levels Ⓧ and Ⓨ of FIG. 18 represent the signals Ⓧ and Ⓨ which would be produced by an adaptive comb filter of the type illustrated FIG. 2 but modified to separate components of PAL composite color video signals, to provide a comparison of the operation of the embodiment of FIGS. 16A and 16B therewith. It will be seen that the FIGS. 16A and 16B embodiment provides the same degree of signal separation under these conditions as that of FIG. 2, while providing the ability to operate reliably despite variations in input signal levels.

Referring to FIG. 18, the phases of further exemplary output signals from band pass filters 121, 122 and 123 are represented by the waveforms a, b and c therein illustrated. In the example of FIG. 18, a phase inversion of the chrominance signal components representing a change to a complementary color is represented by a vertical dashed line in each of the waveforms a, b and c. The logic levels Ⓧ and Ⓨ of FIG. 18 represent signals which would be produced in the same fashion therefor as in the case of FIG. 17 and the remaining waveforms represent the phases and amplitudes of the correspondingly labelled signals coincident with the signals a, b and c represented therein. In the example of FIG. 18, the luminance signal component is constant.

When signals having the phases represented by the waveforms a, b and c of FIG. 18 are supplied as inputs to the first and second adding circuits 11 and 12, they combine subtractively to cancel one another so long as their phases are inverted. Since the phases of the chrominance signal components of the PAL composite color video signal differ by 90° from each horizontal line to the next, chrominance signal components exhibiting good vertical correlation will possess a 180° phase difference when separated by two horizontal line intervals. However, upon the occurrence of a color change as described above, the phases of these signals when separated by two horizontal line intervals coincide, so that when such signals are applied simultaneously to the inputs of the first and second subtracting circuits 4 and 5, their respective output signals, Ⓧ and Ⓨ, exhibit signal dropout. When this occurs, it is detected by the signal correlation comparator 140 through a comparison of the magnitudes of the signals x and y so that, in accordance with the relationships therebetween expressed in the left-hand column of Table VI, the signal Ⓧ or Ⓨ which does not exhibit dropout is thereupon selected, so that the chrominance signal "C" output by the switch 72 under the control of the signal correlation comparator 140 likewise is then free of signal dropout. Since the switching circuit 23 selects the same chrominance signal component under these circumstances, dot interference effects which would otherwise appear in the luminance signal "Y" as a consequence of such chrominance signal dropouts are avoided.

Figure 19:
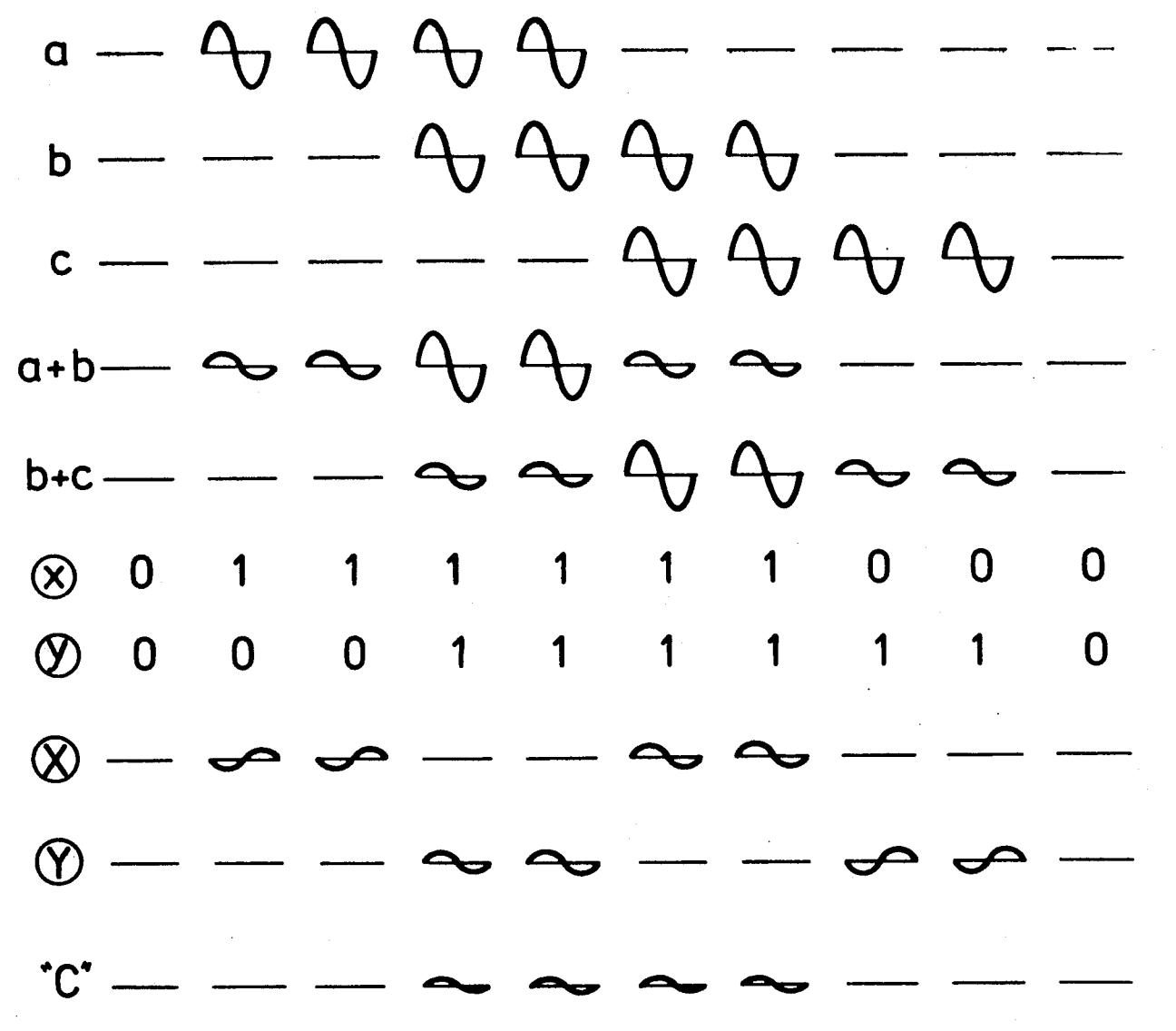

With reference to FIG. 19, the amplitudes and phases of exemplary output signals from band pass filters 121, 122 and 123, are represented by the waveforms a, b and c, respectively, thereof which depict luminance signal components within the frequency band of the chrominance signal, such that the phases thereof coincide on successive horizontal scan lines. The logic levels Ⓧ and Ⓨ of FIG. 19 represent signals which would be produced in the same fashion therefor as in the case of FIG. 17 and the remaining waveforms represent phases and amplitudes of the correspondingly labelled signals coincident with the signals a, b and c represented therein. In the example of FIG. 19, the luminance signal components appear on four successive scan lines, such that for four horizontal line periods during which the luminance signal components appear at the output terminal of the band pass filter 122 represented by the signal b in FIG. 19, the conditions for the selection of the signal Ⓦ obtain so that a chrominance signal "C" as shown in FIG. 19 is provided at the output terminal 24. Accordingly, under the circumstances illustrated in FIG. 19, the adaptive comb filter of FIGS. 16A and 16B is able to derive a chrominance signal "C" in which cross color effects produced by middle and high band components of the luminance signal are minimized, while possessing the ability to operate reliably despite changes in input signal levels.

Figure 20:
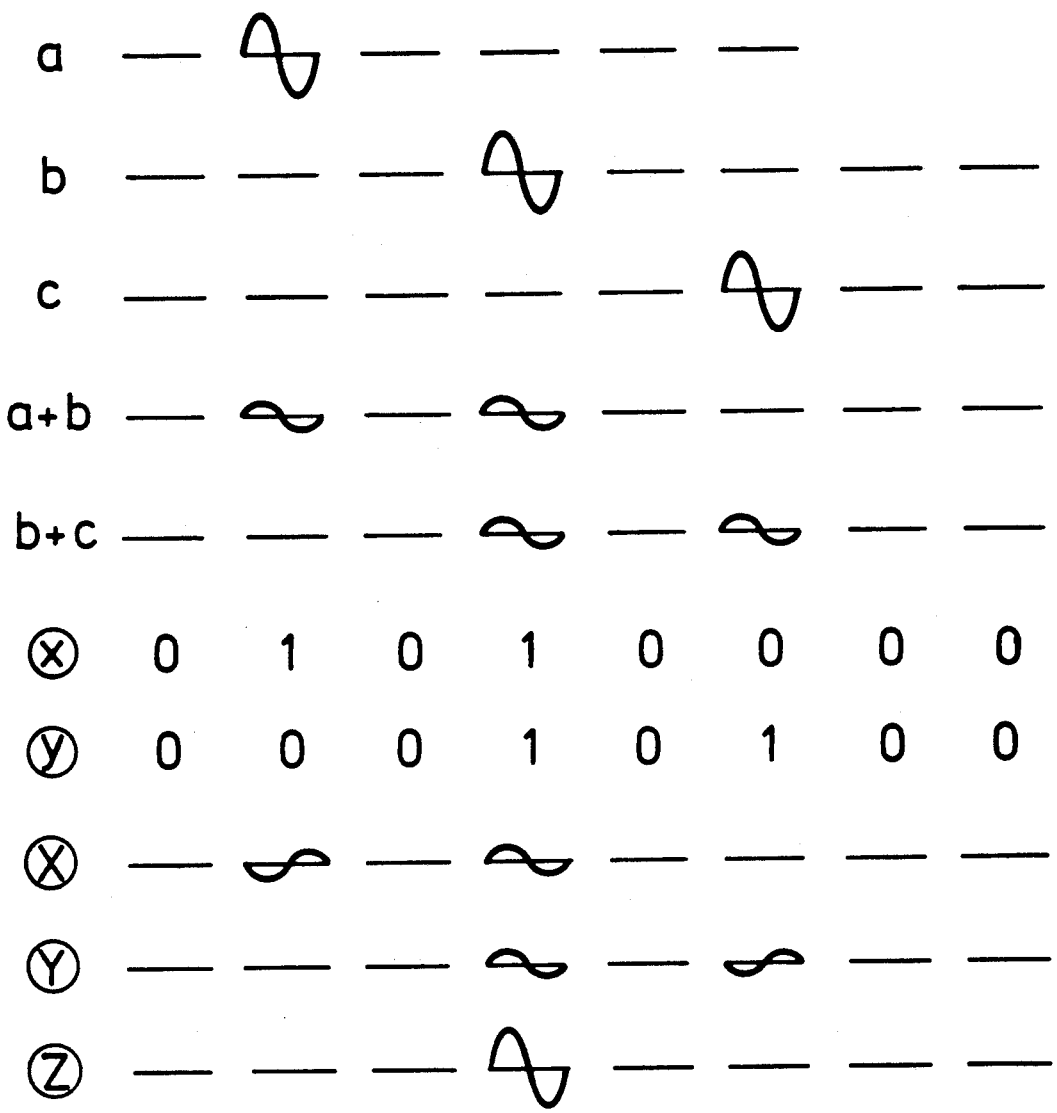
Figure 21:
FIG. 21 is a waveform diagram of input color video signals illustrated in FIG. 20.

With reference now to FIG. 20, the waveforms a, b and c therein represent the existence of a chrominance signal on only one particular scanning line, while the level of the luminance signal is simultaneously constant. The logic levels (x) and (y) of FIG. 20 represent signals which would be produced in the same fashion therefor as in the case of FIG. 17 and the remaining waveforms represent phases and amplitudes of the correspondingly labeled signals coincident with the signals a, b and c represented therein. FIG. 21 illustrates an exemplary waveform component illustrated in FIG. 20. It will be seen from FIG. 20 that, whether the signal (X) or (Y) is selected when this solitary chrominance signal appears at the output of band pass filter 122, a deterioration in the level thereof is unavoidable. Accordingly, the use of either the signal e,crc/X/ or the signal (Y) for producing the chrominance signal "Y" will necessarily result in dot interference.

With reference to Table VI, it will be seen that, when the chrominance signal appears at the output of the band pass filter 122 as the signal b illustrated in FIG. 20, the conditions for the selection of the signal (Z) by the switching circuit 23 are fulfilled, so that a luminance signal "Y" is produced at the output terminal 27 in which dot interference is substantially reduced.

Since the adaptive comb filter according to the present invention is operative to compare the relative magnitudes of input signal values, it is enabled to reliably determine the optimum mode of filter operation despite variations in input signal levels, while at the same time providing separated signal components of high quality in which cross effects are minimized.

It will be appreciated that the adaptive comb filter of the present invention may be implemented in whole or in part using either analog or digital circuitry and that all or part of the signal processing functions thereof may be carried out either by hardwired circuits or with the use of a microprocessor, microcomputer or the like.

Although specific embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An adaptive comb filter for separating at least one component of a video signal, comprising:
 a filter input terminal for receiving said video signal;
 first and second signal delay means for delaying signals supplied to respective input terminals thereof and providing respective delayed input signals at respective output terminals thereof, the input terminal of the first signal delay means being coupled with said filter input terminal and the output terminal thereof being coupled with the input terminal of the second delay means;
 first and second signal subtracting means for each producing output difference signals at a respective output terminal thereof representing a difference between signals supplied to a respective plurality of input terminals thereof, first and second input terminals of the first signal subtracting means each being coupled with a respective one of the input and output terminals of said first signal delay means and first and second input terminals of the second signal subtracting means each being coupled with a respective one of the input and output terminals of said second signal delay means;
 first signal adding means for producing a summation signal at an output terminal thereof representing a summation of signals received at first and second input terminals thereof, said first and second input terminals of said first signal adding means being respectively coupled with said output terminals of said first and second signal subtracting means;
 first switching means for selectively providing one of a plurality of input signals received at respective input terminals thereof to an output terminal thereof, said first switching means having first and second input terminals respectively coupled with said output terminals of said first and second signal subtracting means, a third input terminal coupled with the output terminal of said first signal adding means and a fourth input terminal coupled with the output terminal of said first signal delay means, the output terminal of said switching means being operative to provide a first component of said video signal;
 second and third signal adding means for each producing a summation signal at a respective output terminal thereof representing a summation of signals received at respective first and second input terminals thereof, said first input terminal of each of said second and third signal adding means being coupled with the output terminal of said first signal delay means, said second input terminal of the second signal adding means being coupled with said filter input terminal, and said second input terminal of the third signal adding means being coupled with the output terminal of the second signal delay means;
 first and second absolute value means for each producing an output signal at a respective output terminal thereof representing an absolute value of a signal received at a respective input terminal thereof, the input terminals of said first and second absolute value means being respectively coupled with the output terminals of said second and third signal adding means, respectively; and
 controlling means for controlling the selective provision of input signals by said first switching means to its output terminal based upon a comparison of the magnitudes of the output signals produced at the output terminals of said first and second absolute value means.

2. The adaptive comb filter according to claim 1, further comprising first, second and third band pass filtering means for providing output signals at respective output terminals thereof representing components of input signals received at the input terminals of the respective band-pass filtering means such that components of said input signals outside respective pass bands of said first, second and third band pass filtering means are attenuated at the respective output terminals thereof, the input terminal of the first band pass filtering means being coupled with said filter input terminal and the output terminal thereof being coupled with the second input terminal of said second signal adding means, the input terminal of the second band pass filtering means being coupled with the output terminal of said first signal delay means and the output terminal thereof being coupled with the first input terminal of each of said second and third signal adding means, and the input terminal of the third band pass filtering means being coupled with the output terminal of the second signal delay means and the output terminal of said third band pass filtering means being coupled with the second input terminal of the third signal adding means.

3. The adaptive comb filter according to claim 1, further comprising first and second low pass filtering means for providing output signals at respective output terminals thereof representing components of input signals received at a respective input terminals thereof such that high frequency components of said input signals are attenuated at the respective output terminals of said low pass filtering means, the input terminals of said first and second low pass filtering means being respectively coupled with the output terminals of the first and second absolute value means, respectively, and the output terminals of said first and second low pass filtering means being coupled with said controlling means to provide thereto low pass filtered versions of the output signals produced at the output terminals of said first and second absolute value means.

4. The adaptive comb filter according to claim 1, further comprising third signal delay means for delaying signals supplied to an input terminal thereof and providing the delayed input signals at an output terminal thereof, the input terminal of said third signal delay means being coupled with the filter input terminal, and third signal subtracting means for producing output difference signals at an output terminal thereof representing a difference between signals supplied to first and second input terminals thereof, said first input terminal of said third signal subtracting means being coupled with the output terminal of said third signal delay means and said second input terminal of said third signal subtracting means being coupled with the output terminal of said first switching means, said third signal subtracting means being operative to provide a second component of said video signal at the output terminal thereof.

5. The adaptive comb filter according to claim 4, further comprising band pass filtering means for providing output signals at an output terminal thereof representing components of input signals received at an input terminal of said band pass filtering means such that components of said input signals outside a pass band of said band pass filtering means are attenuated at the output terminal thereof, the input terminal of said band pass filtering means being coupled with the filter input terminal and the output terminal of said band pass filtering means being coupled with the input terminal of said first signal delay means.

6. The adaptive comb filter according to claim 1, wherein said first switching means is operative to provide a chrominance signal component at the output terminal thereof as said first component of said video signal, and further comprising chrominance band pass filtering means for providing output signals at an output terminal thereof representing components of input signals received at an input terminal of said chrominance band pass filtering means such that components of said input signals outside of a predetermined pass band for a chrominance signal component of said video signal are attenuated at said output terminal of the chrominance band pass filtering means, the input terminal of said chrominance band pass filtering means being coupled with the output terminal of said first signal delay means, and the fourth input terminal of said first switching means being coupled with the output terminal of said chrominance band pass filtering means such that the output terminal of said first signal delay means is coupled to the fourth input terminal of said first switching means through said chrominance band pass filtering means.

7. An adaptive comb filter for separating at least a chrominance signal component of a video signal, comprising:

a filter input terminal for receiving said video signal
first and second signal delay means for delaying signals supplied to respective input terminals thereof and providing respective delayed input signals at respective output terminals thereof, the input terminal of the first signal delay means being coupled with said filter input terminal and the output terminal thereof being coupled with the input terminal of the second delay means;

first and second signal subtracting means for each producing output difference signals at a respective output terminal thereof representing a difference between signals supplied to a respective plurality of input terminals thereof, first and second input terminals of the first signal subtracting means each being coupled with a respective one of the input and output terminals of said first signal delay means and first and second input terminals of the second signal subtracting means each being coupled with a respective one of the input and output terminals of said second signal delay means;

first signal adding means for producing a summation signal at an output terminal thereof representing a summation of signals received at first and second input terminals thereof, said first and second input terminals of said first signal adding means being respectively coupled with said output terminals of said first and second signal subtracting means;

chrominance band pass filtering means for providing output signals at an output terminal thereof representing components of input signals received at an input terminal of said chrominance band pass filtering means such that components of said input signals outside of a predetermined pass band for a chrominance signal component of said video signal are attenuated at said output terminal of the chrominance band pass filtering means, the input terminal of said chrominance band pass filtering means being coupled with the output terminal of said first signal delay means, first switching means for selectively providing one of a plurality of input signals received at respective input terminals thereof to an output terminal thereof, said first switching means having first and second input terminals respectively coupled with said output terminals of said first and second signal subtracting means, a third input terminal coupled with the output terminal of said first signal adding means and a fourth input terminal coupled with the output terminal of said chrominance band pass filtering means, the output terminal of said switching means being operative to provide a first component of said video signal;

second and third signal adding means for each producing a summation signal at a respective output terminal thereof representing a summation of signals received at respective first and second input terminals thereof, said first input terminal of each of said second and third signal adding means being coupled with the output terminal of said first signal delay means, said second input terminal of the second signal adding means being coupled with said filter output terminal, and said second input terminal of the third signal adding means being coupled with the output terminal of the second signal delay means;

first and second absolute value means for each producing an output signal at a respective output terminal thereof representing an absolute value of a signal received at a respective input terminal thereof, the input terminals of said first and second absolute value means being respectively coupled with the output terminals of said second and third signal adding means, respectively; and controlling means for controlling the selective provision of input signals by said first switching means to its output terminal based upon a relative value of the output signals produced at the output terminals of said first and second absolute value means;

said controlling means including correlation detecting means for detecting horizontal correlation of luminance signal components in the summation signals produced at the output terminals of said second and third signal adding means, said controlling means being operative to control said first switching means to inhibit selection thereby of input signals from said chrominance band pass filtering means upon detection of said horizontal correlation of luminance signal components in said summation signals.

8. The adaptive comb filter according to claim wherein said first switching means is operative to provide a chrominance signal component at the output terminal thereof as said first component of said video signal, said adaptive comb filter further comprising luminance separation means for separating a luminance component of said video signal, said luminance separation means including:

third signal delay means for delaying said video signal by an interval substantially equal to a signal delay between said video signal and said chrominance signal component provided at the output terminal of said first switching means to provide a delayed video signal at an output terminal of said third signal delay means;

signal subtraction means for attenuating chrominance signal components in said delayed video signal by subtractive combination therewith of s id chrominance signal component provided at the output terminal of said first switching means to provide a separated luminance signal component of said video signal at an output terminal of said signal subtraction means.

9. An adaptive comb filter for separating a chrominance signal component and a luminance component of a video signal, comprising:

a filter input terminal for receiving said video signal;

first and second signal delay means for delaying signals supplied to respective input terminals thereof and providing respective delayed input signals at respective output terminals thereof, the input terminal of the first signal delay means being coupled with said filter input terminal and the output terminal thereof being coupled with the input terminal of the second delay means;

first and second signal subtracting means for each producing output difference signals at a respective output terminal thereof representing a deference between signals supplied to a respective plurality of input terminals thereof, first and second input terminals of the first signal subtracting means each being coupled with a respective one of the input and output terminals of said first signal delay means and first and second input terminals of the second signal subtracting means each being coupled with a respective one of the input and output terminals of said second signal delay means;

first signal adding means for producing a summation signal at an output terminal thereof representing a summation of signals received at first and second input terminals thereof, said first and second input terminals of said first signal adding means being respectively coupled with said output terminals of said first and second signal subtracting means;

first switching means for selectively providing one of a plurality of input signals received at respective input terminals thereof to an output terminal thereof, said first switching means having first and second input terminals respectively coupled with said output terminals of said first and second signal subtracting means, a third input terminal coupled with the output terminal of said first signal adding means and a fourth input terminal coupled with the output terminal of said first signal delay means, the output terminal of said switching means being operative to provide a first component of said video signal;

second and third signal adding means for each producing a summation signal at a respective output terminal thereof representing a summation of signals received at respective first and second input terminals thereof, said first input terminal of each of said second and third signal adding means being coupled with the output terminal of said first signal delay means, said second input terminal of the second signal adding means being coupled with said filter input terminal, and said second input terminal of the third signal adding means being coupled with the output terminal of the second signal delay means;

first and second absolute value means for each producing an output signal at a respective output terminal thereof representing an absolute value of a signal received at a respective input terminal thereof, the input terminals of said first and second absolute value means being respectively coupled with the output terminals of said second and third signal adding means, respectively;

controlling means for controlling the selective provision of input signals by said first switching means to its output terminal based upon a relative value of the output signals produced at the output terminals of said first and second absolute value means;

third signal delay means for delaying said video signal by an interval substantially equal to a signal delay between said video signal and said first component of said video signal provided at the output terminal of said first switching means to provide a delayed video signal at an output terminal of said third signal delay means;

signal subtraction means for attenuating chrominance signal components in said delayed video signal by subtractive combination therewith of said first component of said video signal provided at the output terminal of said first switching means to provide a separated luminance signal component of said video signal at an output terminal of said signal subtraction means; and second switching means for selectively providing one of a plurality of input signals received at respective input terminals thereof to an output terminal of said second switching means, said second switching means having first and second input terminals coupled with the output terminals of said first and second signal subtracting means, respectively, and a third input terminal coupled with the output terminal of said first signal adding means, said second switching means being operative to provide a chrominance signal component of said video signal at the output terminal thereof;

said controlling means being operative to control said second switching means to select an input signal received at the third input terminal thereof as said chrominance signal component of said video signal when said controlling means controls said first switching means to select an input signal received at the fourth input terminal thereof.

10. An adaptive comb filter for separating at least one component of a video signal, comprising:

a filter input terminal for receiving said video signal;

first delay means for delaying said video signal by a first interval to produce a first delayed video signal;

second delay means for delaying said video signal by a second interval to produce a second delayed video signal;

first difference means for producing a first difference signal proportional to a difference between said video signal and said first delayed video signal;

second difference means for producing a second difference signal proportional to a difference between said first delayed video signal and said second delayed video signal;

first summing means for producing a first summation signal proportional to a summation of said first difference signal and said second difference signal;

first signal selecting means for controllably selecting one of said first difference signal, said second difference signal and said first summation signal as said at least one component of said video signal;

second summing means for producing a second summation signal proportional to a summation of said video signal and said first delayed video signal;

third summing means for producing a third summation signal proportional to a summation of said first delayed video signal and said second delayed video signal; and control means for controlling the selection of one of said first difference signal, said second difference signal and said first summation signal by said first signal selecting means based upon relative magnitudes of said second summation signal and said third summation signal.

11. The adaptive comb filter according to claim 10, wherein said control means further comprises absolute value means for producing first and second absolute value signals proportional to the absolute values of the magnitudes of said second summation signal and said third summation signal, respectively, and wherein said control means is operative to compare the magnitudes of said first and second absolute value signals of controlling the selection of said at least one component of said video signal.

12. The adaptive comb filter according to claim 11, further comprising low pass filtering means for attenuating high frequency components of said first and second absolute value signals.

13. The adaptive comb filter according to claim 10, wherein said control means is operative to control the selection of said at least one component of said video signal based upon relative magnitudes of said first difference signal and said second difference signal.

14. An adaptive comb filter for separating at least one component of a video signal, comprising:

a filter input terminal for receiving said video signal;

first delay means for delaying said video signal by a first interval to produce a first delayed video signal;

second delay means for delaying said video signal by a second interval to produce a second delayed video signal;

first difference means for producing a first difference signal proportional to a difference between said video signal and said first delayed video signal;

second difference means for producing a second difference signal proportional to a difference between said video signal and said first delayed video signal;

first summing means for producing a first summation signal proportional to a summation of said first difference signal and said second difference signal;

first signal selecting means for controllably selecting one of said first difference signal, said second difference signal and said first summation signal as said at least one component of said video signal;

second summing means for producing a second summation signal proportional to a summation of said video signal and said first delayed video signal;

third summing means for producing a third summation signal proportional to a summation of said first delayed video signal and said second delayed video signal; and control means for controlling the selection of said at least one component of said video signal from among said first difference signal, said second difference signal and said first summation signal by said first signal selecting means based upon relative magnitudes of said second summation signal, said third summation signal, said video signal, said first delayed video signal and said second delayed video signal.

15. The adaptive comb filter according to claim 10, wherein said first signal selecting means is operative to provide a chrominance signal as said at least one component of said video signal.

16. The adaptive comb filter according to claim 15, wherein said first delay means is operative to delay said video signal by an interval substantially equal to one horizontal line interval of said video signal, and said second delay means is operative to delay said video signal by an interval substantially equal to two horizontal line intervals of said video signal.

17. The adaptive comb filter according to claim 15, wherein said first delay means is operative to delay said video signal by an interval substantially equal to two horizontal line intervals of said video signal, and said second delay means is operative to delay said video signal by an interval substantially equal to four horizontal line intervals of said video signal.

18. The adaptive comb filter according to claim 15, further comprising first band pass filtering means for filtering said first delayed video signal to attenuate components thereof outside a first chrominance signal pass band to produce a band pass filtered signal, and wherein said first signal selecting means is operative to select one of said band pass filtered signal, said first difference signal, said second difference signal and said first summation signal as said chrominance signal.

19. The adaptive comb filter according to claim 18, further comprising luminance separation means for separating a luminance component of said video signal, said luminance separation means including:
   second band pass filtering means for filtering said chrominance signal to attenuate components thereof outside a second chrominance signal pass band to produce a band pass filtered chrominance signal, said second chrominance signal pass band being relatively narrower than said first chrominance signal pass band of said first band pass filtering means;
   third delay means for delaying said video signal by a third interval substantially equal to a signal delay between said video signal and said band pass filtered chrominance signal to produce a delayed video signal; and
   subtractive combining means for producing said luminance component by attenuating chrominance signal components of said delayed video signal with the use of said band pass filtered chrominance signal.

20. The adaptive comb filter according to claim 15, further comprising luminance separation means for separating a luminance component of said video signal, said luminance separation means including:
   third delay means for delaying said video signal by a delay interval substantially equal to a signal delay between said video signal and said chrominance signal to produce a third delayed video signal; and
   subtractive combining means for producing said luminance component by attenuating chrominance signal components of said third delayed video signal with the use of the chrominance signal provided by said first signal selecting means.

21. The adaptive comb filter according to claim 20, wherein said third delay means is operative to further delay said first delayed video signal to provide said third delayed video signal.

22. The adaptive comb filter according to claim 20, further comprising first band pass filtering means for filtering said video signal received at said filter input terminal to attenuate components thereof outside a chrominance signal pass band to produce a band pass filtered signal, said first band pass filtering means being coupled with said first delay means, said second delay means and said first difference means to provide said band pass filtered signal thereto as said video signal, and wherein said third delay means is coupled with said filter input terminal to receive said video signal therefrom.

23. An adaptive comb filter for separating at least a chrominance signal component of a video signal, comprising;
   a filter input terminal for receiving said video signal;
   first delay means for delaying said video signal by a first interval to produce a first delayed video signal;
   first band pass filtering means for filtering said first delayed video signal to attenuate components thereof outside a first chrominance signal pass band to produce a band pass filtered signal;
   second delay means for delaying said video signal by a second interval to produce a second delayed video signal;
   first difference means for producing a first difference signal proportional to a difference between said video signal and said first delayed video signal;
   second difference means for producing a second difference signal proportional to a difference between said first delayed video signal and said second delayed video signal;
   first summing means for producing a first summation signal proportional to a summation of said first difference signal and said second difference signal;
   first signal selecting means for controllably selecting one of said band pass filtered signals, said first difference signal, said second difference signal and said first summation signal as said at lest one component of said video signal;
   second summing means for producing a second summation signal proportional to a summation of said video signal and said first delayed video signal;
   third summing means for producing a third summation signal proportional to a summation of said first delayed video signal and said second delayed video signal;
   correlation detecting means for detecting horizontal correlation of luminance signal components in said second summation signal and said third summation signal; and
   control means for controlling the selection of one of said first difference signal, said second difference signal and said first summation signal by said first signal selecting means based upon relative magnitudes of said second summation signal and said third summation signal, said control means being operative to control said first signal selecting means to inhibit selection of said band pass filtered signal upon detection said horizontal correlation of luminance signal components.

24. The adaptive comb filter according to claim 15, further comprising first, second and third band pass filtering means for attenuating components of said video signal, said first delayed video signal and said second delayed video signal, respectively, which are outside a chrominance signal pass band, the first band pass filtering means having an input terminal coupled with said filter input terminal and an output terminal coupled with said first difference means and said second summing means to provide the band pass filtered signal thereto, the second band pass filtering means having an input terminal coupled with said first delay means and an output terminal coupled with said first difference means, said second difference means, said second summing means and said third summing means to provide the band pass filtered first delayed video signal thereto, and the third band pass filtering means having an input terminal coupled with said second delay means and an output terminal coupled with said second difference means and said third summing means to provide the band pass filtered second delayed video signal thereto.

25. An adaptive comb filter for separating at least a chrominance signal component and a luminance component of a video signal, comprising:
   a filter input terminal for receiving said video signal;
   first delay means for delaying said video signal by a first interval to produce a first delayed video signal;

second delay means for delaying said video signal by a second interval to produce a second delayed video signal;

third delay means for delaying said video signal by a delay interval substantially equal to a signal delay between said video signal and said first component of said video signal to produce a third delayed video signal;

subtractive combining means for producing said luminance component by attenuating chrominance signal components of said third delayed video signal with the use of the component of said video signal provided by said first signal selecting means; said output chrominance signal when said control means controls said first signal selecting means to select said first delayed video signal.

26. The adaptive comb filter according to claim 25, further comprising band pass filtering means for attenuating components of said first component of said video signal provided by said first signal selecting means outside of a chrominance signal pass band and coupled with said subtractive combining means to supply the band pass filtered first component of said video signal thereto.

27. A method of separating a chrominance signal from a composite color video signal, comprising the steps of:

delaying said composite color video signal by a first interval to produce a first delayed video signal;

delaying said composite color video signal by a second interval to produce a second delayed video signal;

producing a first difference signal proportional to a difference between said composite color video signal and said first delayed video signal;

producing a second difference signal proportional to a difference between said first delayed video signal and said second delayed video signal;

producing a second difference signal proportional to a summation of said first difference signal and said second difference signal;

producing a second summation signal proportional to a summation of said composite color video signal and said first delayed video signal;

producing a third summation signal proportional to a summation of said first delayed video signal and said second delayed video signal; and selecting one of said first difference signal, said second difference signal and said first summation signal as said chrominance signal based upon a comparison of relative magnitudes of said second summation signal and said third summation signal.

* * * * *